(12) United States Patent
Matsuura

(10) Patent No.: US 9,847,410 B2
(45) Date of Patent: Dec. 19, 2017

(54) SEMICONDUCTOR DEVICE AND METHOD OF MANUFACTURING THE SAME

(71) Applicant: RENESAS ELECTRONICS CORPORATION, Tokyo (JP)

(72) Inventor: Hitoshi Matsuura, Ibaraki (JP)

(73) Assignee: RENESAS ELECTRONICS CORPORATION, Tokyo (JP)

( * ) Notice: Subject to any disclaimer, the term of this patent is extended or adjusted under 35 U.S.C. 154(b) by 0 days.

(21) Appl. No.: 15/151,094

(22) Filed: May 10, 2016

(65) Prior Publication Data

US 2016/0359026 A1    Dec. 8, 2016

(30) Foreign Application Priority Data

Jun. 3, 2015    (JP) .................................. 2015-113074

(51) Int. Cl.
*H01L 29/66*    (2006.01)
*H01L 29/739*    (2006.01)
(Continued)

(52) U.S. Cl.
CPC ...... *H01L 29/7397* (2013.01); *H01L 29/0619* (2013.01); *H01L 29/0623* (2013.01);
(Continued)

(58) Field of Classification Search
CPC ............. H01L 29/7397; H01L 29/0696; H01L 29/0619; H01L 29/0623; H01L 29/42376;
(Continued)

(56) References Cited

U.S. PATENT DOCUMENTS 5,471,075 A *  11/1995  Shekar ................ H01L 29/0839
257/139
6,153,896 A    11/2000  Omura et al.
(Continued)

FOREIGN PATENT DOCUMENTS

JP    2003-188382 A    7/2003
JP    2003-520430 A    7/2003
JP    2013-140885 A    7/2013

OTHER PUBLICATIONS

M. Sumitomo et al., "Low Loss IGBT with Partially Narrow Mesa Structure (PNM-IGBT)", Proceedings of the 24th International Symposium on Power Semiconductor Devices and ICs, ISPSD'12, pp. 17-20, 2012.

*Primary Examiner* — Julio J Maldonado
*Assistant Examiner* — Stanetta Isaac
(74) *Attorney, Agent, or Firm* — McDermott Will & Emery LLP

(57) ABSTRACT

A semiconductor device including an IGBT element having features of a low on-state voltage and a low turn-off loss is provided. The semiconductor device is comprised of a trench gate type IGBT element. The IGBT element includes: a plurality of gate trench electrodes to which gate potential is given; and a plurality of emitter trench electrodes to which emitter potential is given. Between adjacent trench electrodes, a contact to an emitter electrode layer is formed. In this regard, there is formed, in the semiconductor substrate, a P type floating region which is in contact with bottom portions of at least some of the emitter trench electrodes via an interlayer insulation layer.

8 Claims, 40 Drawing Sheets

(51) Int. Cl.
*H01L 29/423* (2006.01)
*H01L 29/06* (2006.01)
*H01L 29/10* (2006.01)

(52) U.S. Cl.
CPC .... *H01L 29/0696* (2013.01); *H01L 29/42376* (2013.01); *H01L 29/66348* (2013.01); *H01L 29/1095* (2013.01)

(58) Field of Classification Search
CPC .......... H01L 29/66348; H01L 29/1095; H01L 29/66234; H01L 29/66325; H01L 29/66333; H01L 2924/13055; H01L 2009/544; H01L 29/7428
See application file for complete search history.

(56) References Cited

U.S. PATENT DOCUMENTS

| | | | |
|---|---|---|---|
| 6,392,273 B1 | 5/2002 | Chang | |
| 9,041,050 B2 | 5/2015 | Matsuura | |
| 2013/0175574 A1* | 7/2013 | Matsuura | H01L 29/66348 257/139 |

* cited by examiner

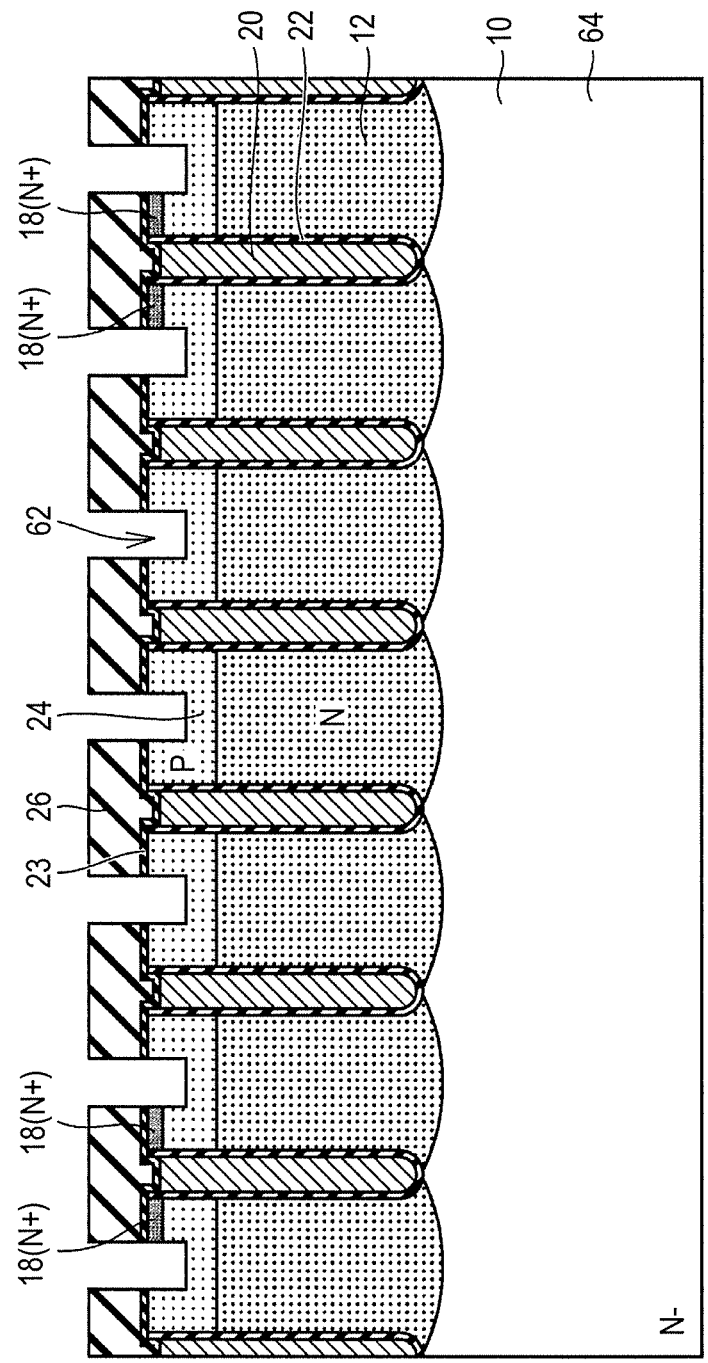
FIG. 19
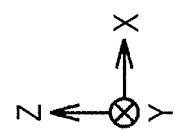

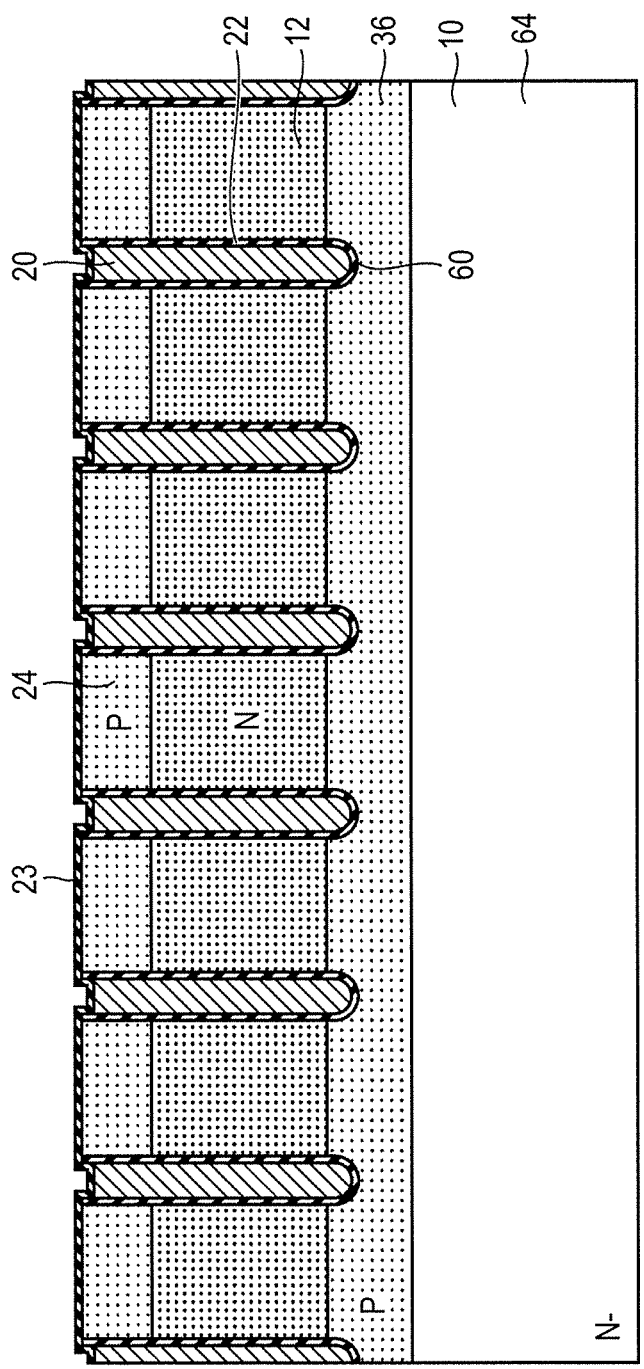
FIG. 35
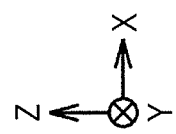

SEMICONDUCTOR DEVICE AND METHOD OF MANUFACTURING THE SAME

CROSS-REFERENCE TO RELATED APPLICATIONS

The disclosure of Japanese Patent Application No. 2015-113074 filed on Jun. 3, 2015 including the specification, drawings and abstract is incorporated herein by reference in its entirety.

BACKGROUND

The present invention relates to a semiconductor device and a method of manufacturing the same, which is, for example, suitably applicable to a semiconductor device including a trench gate type IGBT (Insulated Gate Bipolar Transistor).

As to a power semiconductor device including an IGBT, it is desirable to have features of a low on-state voltage and a high-speed turn-off. A first method to achieve the low on-state voltage in the trench gate type IGBT is to provide a region where a pitch between trench gates is wide and a region where a pitch between trench gates is narrow. Further, in the region where the pitch between the trench gates is wide, a floating layer is provided in place of a contact to an emitter electrode (see, for example, Japanese Unexamined Patent Application Publication No. 2013-140885 [Patent Document 1]). In such a case, a hole current flows only in a portion where a spacing between the trench gates is narrow and a hole concentration increases near the emitter electrode. Since electrons are induced there (carrier injection effect), the on-state voltage can be decreased.

A second method for achieving the low on-state voltage is to narrow a pitch spacing while allowing the pitch between the trench gates to be uniform. According to the second method, in order to reduce the gate capacitance, emitter potential is given in place of gate potential to some of the trench gates (see, for example, Japanese Unexamined Patent Application Publication No. 2003-188382 [Patent Document 2]).

As a method similar to the second method described above, Non-patent Document 1 discloses a following method. In the method, the width of mesa between trenches is minimized by widening a width of the trench gate itself, which prevents an easy flow of the hole current. As a result, the carrier injection effect is enhanced.

Further, though not directly related to the above, in the trench gate type IGBT, in order to prevent an electric field concentration onto a bottom portion of the trench gate, there is a case where a floating P region is provided near the bottom portion of the trench gate (see, for example, Japanese Unexamined Patent Application Publication (Translation of PCT Application) No. 2003-520430 [Patent Document 3]).

[Patent Document 1]
Japanese Unexamined Patent Application Publication No. 2013-140885
[Patent Document 2]
Japanese Unexamined Patent Application Publication No. 2003-188382
[Patent Document 3]
Japanese Unexamined Patent Application Publication (Translation of PCT Application) No. 2003-520430
[Non-patent Document 1]
M. Sumitomo et al., "Low Loss IGBT with Partially Narrow Mesa Structure (PNM-IGBT)", Proceedings of the 24th International Symposium on Power Semiconductor Devices and ICs, ISPSD'12, pp. 17-20, and 2012.

SUMMARY

When studying the above second method of reducing on-resistance, the inventors of the present application have found out a problem as follows that has not been known yet. That is, when a pitch between trench gates is narrowed, a region between two adjacent trenches comes to have a substantially uniform potential, delaying discharge operation of holes at the time of a turn-off, which will be described in detail in embodiments below. Thus, when the pitch between the trench gates is narrowed, a turn-off loss increases.

Other problems and novel features will be apparent from the description of the present specification and the accompanying drawings.

A semiconductor device according to one embodiment has a trench gate type IGBT element formed over a semiconductor substrate. The IGBT element includes: a plurality of gate trench electrodes to which gate potential is given; and a plurality of emitter trench electrodes to which emitter potential is given. A contact to an emitter electrode layer is formed between every two adjacent trench electrodes. In this regard, in the semiconductor substrate, a P type floating region being in contact with bottom portions of at least some of the emitter trench electrodes via an insulation film is formed.

According to the above embodiment, the semiconductor device including the IGBT element having features of a low on-state voltage and a low turn-off loss can be provided.

BRIEF DESCRIPTION OF THE DRAWINGS

FIG. 19 is a cross-sectional view in a manufacturing step of the IGBT element showing a state where the contact trench is dug into an inner portion of the P type body;

FIG. 35 is a cross-sectional view in a manufacturing step of the IGBT element in FIG. 32 after forming the P type floating region (after step S255 in FIG. 30);

DETAILED DESCRIPTION

Figure 1:
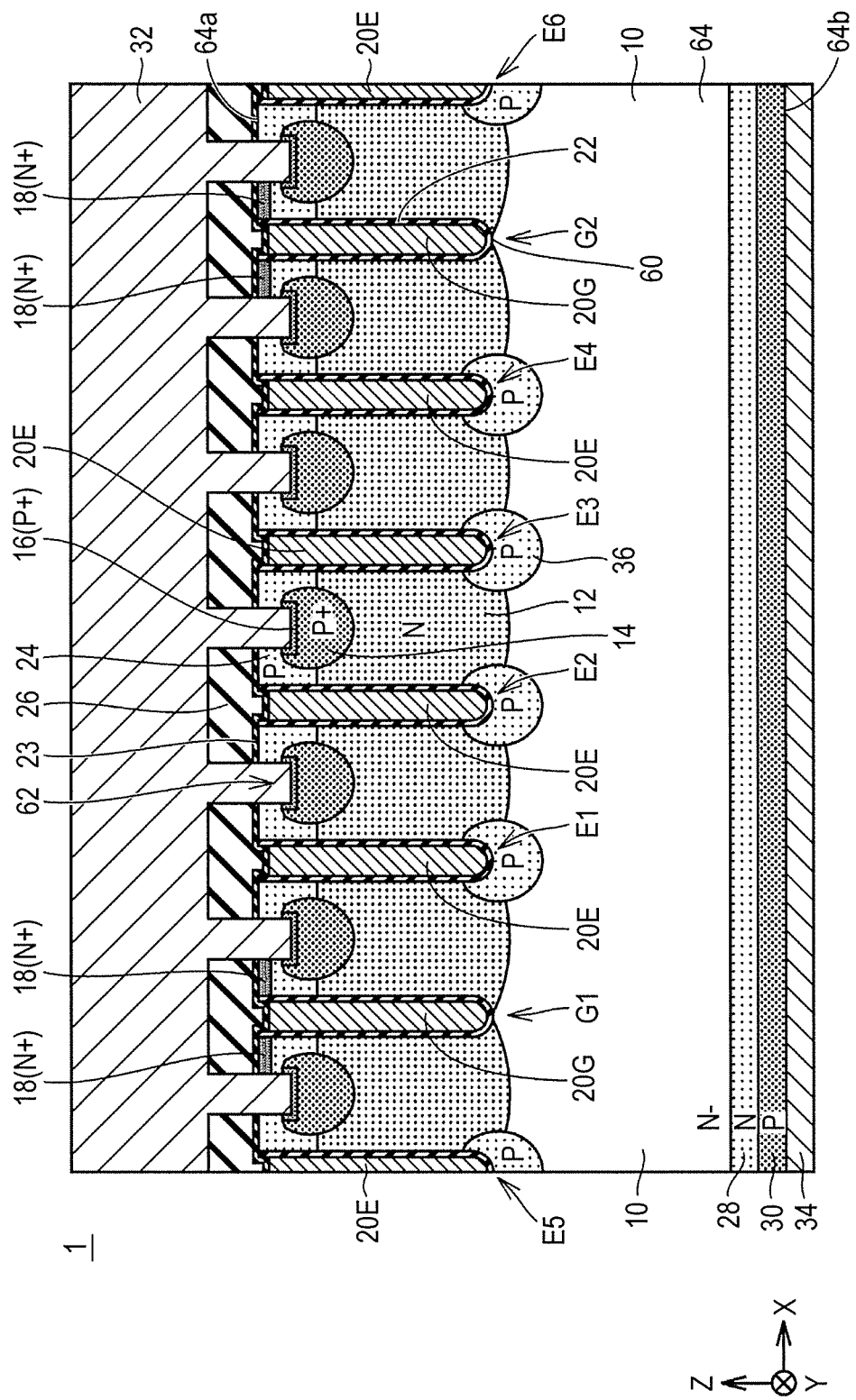
FIG. 1 is a cross-sectional view showing a configuration of an IGBT element according to First Embodiment.

Now, embodiments of the invention will be described in detail with reference to the drawings. However, each of the cross-sectional views and plan views represents a typical example, and a dimensional size of each drawing is not proportional to an actual dimension thereof. In the following explanations, the same or similar parts are denoted by the same reference characters and description thereof is not repeated in principle.

<First Embodiment>

[Configuration of IGBT]

FIG. 1 is a cross-sectional view showing a configuration of an IGBT element 1 according to First Embodiment. In the cross-sectional view of the present specification, a direction perpendicular to a semiconductor substrate is referred to as "Z direction," and directions in a plane of the semiconductor substrate are referred to as "X direction" and "Y direction." In FIG. 1, an XZ cross-section is shown. Although both ends in X direction are cut out, in fact, the same configuration is periodically repeated several times. It is assumed that, in Y direction, cross-sectional forms similar to those in FIG. 1 are provided in series (that is, each layer and each region extend in Y direction). However, a plurality of P type floating regions 36 and the N+ type emitter regions 18 may be locally provided in Y direction. Such examples will be explained in Fifth Embodiment.

The IGBT element 1 is formed based on an N− type semiconductor substrate 64 which is mainly used as an N− type drift layer 10. In the description below, a surface on the +Z direction side (upper side) of the N− type semiconductor substrate 64 is referred to as "a first main surface or a surface (front surface)," and a surface on the −Z direction side (lower side) is referred to as "a second main surface or a back surface."

As shown in FIG. 1, the IGBT element 1 includes, as impurity layers, from the side close to the first main surface 64a of the N− type semiconductor substrate 64, a P type body layer 24 and an N type hole barrier layer 12. The IGBT element 1 further includes, from the side close to the second main surface 64b, a P type collector layer 30 and an N type field stop layer 28. A region sandwiched between the N type hole barrier layer 12 and the N type field stop layer 28 is used as an N− type drift layer 10.

The N type hole barrier layer 12, whose impurity concentration is higher than that of the N− type drift layer 10, is provided between the N− type drift layer 10 and the P type body layer 24 so that drawing out of holes to the metal emitter electrode layer 32 to be described later can be suppressed, bringing about an effect of enhancing conductivity modulation and reducing an on-state voltage. However, the N type hole-barrier layer 12 is not essential. When it is not provided, the region for the N type hole-barrier layer 12 becomes the N− type drift layer 10.

It becomes possible to prevent a depletion layer from reaching the P type collector layer 30 at the off time by providing an N type field stop layer 28, whose impurity concentration is higher than that of the N− type drift layer 10, between the N− type drift layer 10 and the P type collector layer 30. The N type field stop layer 28 is not essential and, when it is not provided, the N− type drift layer 10 should be made thicker.

In the IGBT element 1, there are formed a plurality of trenches (grooves) 60 which pass through the P type body layer 24 from the first main surface 64a and reach a vicinity of a boundary between the N− type drift layer 10 and the N type hole barrier layer 12. In a plan view of the semiconductor substrate 64, a plurality of trenches 60 extend in Y direction, and are arranged in a row in X direction. The IGBT element 1 includes: a gate insulation film 22 formed over an inner surface of each trench 60; and buried electrodes (also called trench electrodes) 20 (20G, 20E) which are embedded inside the trenches 60 via gate insulation layers 22.

The buried electrodes 20 includes: an electrode which is used as a gate electrode (gate trench electrode 20G); and an electrode (emitter trench electrode 20E) to which emitter potential (the potential of a metal emitter electrode layer 32 to be described later) is given. In the case shown in FIG. 1, the gate trench electrodes 20G are formed inside trenches G1 and G2 and the emitter trench electrodes 20E are formed inside the trenches E1 to E6.

As shown in FIG. 1, in general, trenches 60 (E5, G1, E1 to E4, G2, E6) are formed with a uniform pitch. However, the uniform pitch is not essential. Also, in FIG. 1, one gate trench electrode 20G (trench G1) and a series of four emitter trench electrodes 20E (trenches E1 to E4) are alternately arranged in a repeated manner in X direction. However, the configuration is not limited to this. For example, the number of emitter trench electrodes 20E to be arranged in series may be increased or decreased. Alternatively, a plurality of gate trench electrodes 20G may be arranged in series.

In general, gate capacitance can be reduced by increasing a ratio of the emitter trench electrodes 20E relative to the gate trench electrodes 20G. On the other hand, saturation current density can be raised by increasing a ratio of the gate trench electrodes 20G relative to the emitter trench electrodes 20E. The narrower the pitch of the trench 60 is made for improving a hole accumulation effect, the higher the trench density in the same chip area becomes. Therefore, it is necessary to increase the ratio of the emitter trench electrodes 20E to suppress the increase in gate capacitance.

The IGBT element 1 further includes: a plurality of N+ type emitter regions 18; an interlayer insulation layer 26; a metal emitter electrode layer 32; a plurality of P+ type body contact regions 16; a plurality of P+ type latch-up preventing regions 14; and a metal collector electrode layer 34. Also, in the case shown in FIG. 1, a thin insulation film 23 for ion implantation is formed over surfaces of the buried electrode 20 and the P type body layer 24.

The plural N+ type emitter regions 18 are formed over a front surface portion of the P type body layer 24 being adjacent to both sides (or one side) of the gate trench electrode 20G. The N+ type emitter region 18 is electrically coupled to the metal emitter electrode layer 32.

The interlayer insulation layer 26 is formed over a first main surface 64a of the semiconductor substrate 64. The interlayer insulation layer 26 is placed between the buried electrode 20 and the metal emitter electrode layer 32 to achieve electrical insulation between them. As shown in FIG. 1, between every two adjacent buried electrodes 20, there is formed a contact trench 62 (or a contact hole) passing through the interlayer insulation layer 26 and reaching an inner portion of the P type body layer 24. The N+ type emitter region 18 is provided between the contact trench 62 and the gate trench electrode 20G.

The metal emitter electrode layer 32 is formed over an upper surface of the interlayer insulation layer 26 so as to fill the contact trench 62. Thus, the metal emitter electrode layer 32 is electrically coupled to the N+ type emitter region 18 and the P type body layer 24. Therefore, in the case of the configuration of the IGBT element 1 shown in FIG. 1, between the every two adjacent trenches 60, the metal emitter electrode layer 32 is always electrically coupled to the P type body layer 24. That is, in an IGBT cell (a basic configuration of the IGBT element 1), there is no obstacle to block a discharge route of holes.

At the bottom of the contact trench 62, the P+ type body contact region 16 is provided in the boundary between the metal emitter electrode layer 32 and the P type body layer 24. By allowing an impurity concentration of the P+ type body contact region 16 to be greater than that of the P type body layer 24, a favorable Ohmic contact can be achieved between the P+ type body contact region 16 and the metal emitter electrode layer 32.

The P+ type latch-up preventing region 14 is formed, when P+ impurities are injected, near a central portion between every two adjacent trenches 60, in a region between a lower end of the P+ type body contact region 16 and an upper portion of an N type hole barrier layer 12. That is, the P+ type latch-up preventing regions 14 are formed inside the P type body layer 24 and a part of the region of the N type hole barrier layer 12. An impurity concentration of the P+ type latch-up preventing region 14 is higher than that of the P type body layer 24. The P+ type latch-up preventing region 14 is not essential. However, by providing this region, at the time of a turn-off, it becomes easier for holes to escape into the metal emitter electrode layer 32, and an occurrence of the latch-up phenomenon can be suppressed.

The P+ type body contact region 16 and the P+ type latch-up preventing region 14 are not in contact with the trench 60. Between the two regions, there is provided a P type body layer 24 whose impurity concentration is lower. The reason is that an inversion layer (channel) must be formed in the P type body layer 24 near the gate trench electrode 20G when the IGBT1 is in an on state.

The metal collector electrode layer 34 is so formed over the second main surface 64b of the semiconductor substrate 64 as to be in contact with the P type collector layer 30.

The IGBT element 1 further includes a plurality of P type floating regions 36 which are provided near a boundary between the N type hole barrier layer 12 and the N− type drift layer 10 and are in contact with the emitter trench electrodes 20E via the gate insulation film 22. In the case shown in FIG. 1, the P type floating region 36 is provided near a bottom portion of each emitter trench electrode 20E. As will be described in Fourth and Fifth Embodiments, the P type floating regions 36 may be so formed as to extend in X direction, that is, to join bottom portions of the trenches where a plurality of emitter trench electrodes 20E are embedded.

The P type floating region 36 has the effect of promoting the discharge of holes at the time of a turn-off. The operation of the hole discharge will be described in detail with reference to FIG. 3 later. The P type floating region 36 prevents the flow of electrons. Therefore, it is desirable not to provide the P type floating regions 36 near bottom portions of the trenches G1 and G2 for the gate trench electrode 20G. To be more precise, it is desirable not to provide the P type floating region 36 immediately below the N+ type emitter region 18.

[Problem of Narrowed Trench Pitch]

In the configuration of the IGBT element 1 shown in FIG. 1, the pitch of the trench 60 is narrowed to prevent the easy flow of holes in an on state. As a result, the holes are accumulated near the N− type drift layer 10 in the vicinity of the trench bottom. Accordingly, injection efficiency of electrons from the N+ type emitter region 18 is improved, thereby the effect of lowering the on-state voltage can be expected. However, the inventors of the present application found out the following problem. That is, in a configuration where the P type floating region 36 of FIG. 1 is not provided, when the pitch of the trench 60 is narrowed, the turn-off time increases because the easy discharge of the holes during the turn-off is prevented. As a result, the switching loss (the tail loss, in particular) increases. Hereafter, this phenomenon will be explained.

Figure 2A:
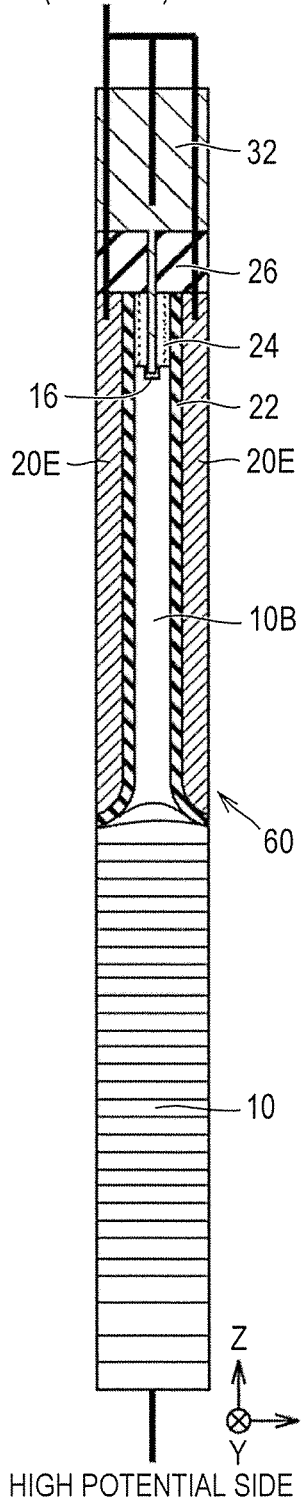
FIGS. 2A and 2B show potential distribution of an N− type drift layer in an IGBT element 1 in an off state.
Figure 2B:
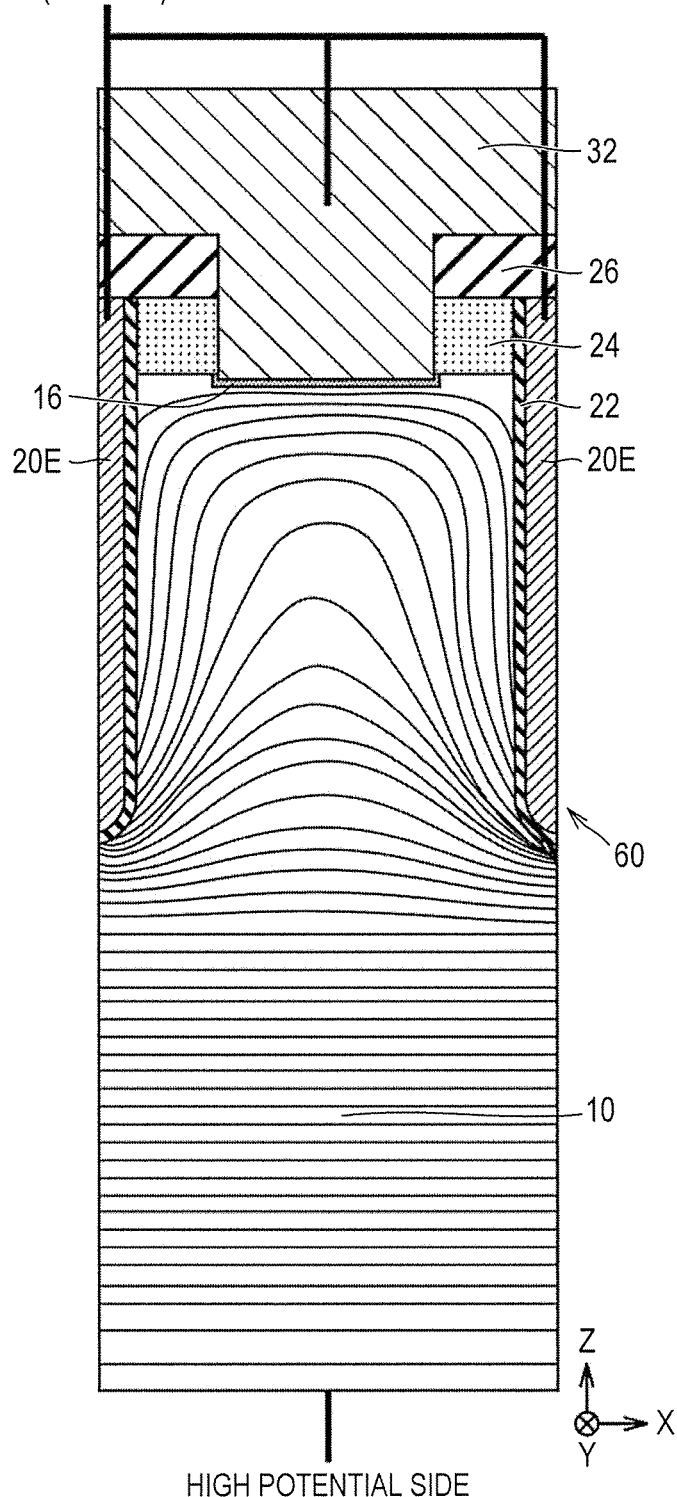

FIGS. 2A and 2B show potential distribution of the N− type drift layer in the IGBT element 1 in an off state. In FIGS. 2A and 2B, a cross-section between adjacent emitter trench electrodes 20E is shown. For the sake of simplicity, the P+ type latch-up preventing region 14 and the N type hole barrier layer 12 are not provided. Emitter potential Vee (0V) is given to the emitter trench electrode 20E and the metal emitter electrode layer 32. The lower end of the N-drift layer 10 is a high potential side (collector side). FIG. 2A shows a potential distribution (equipotential line) of the N− type drift layer 10 where the pitch of the trench 60 is relatively narrow. Also, FIG. 2B shows a potential distribution (equipotential line) of the N− type drift layer 10 where the pitch of the trench 60 is relatively wide.

When the IGBT element 1 is in the off state, a depletion layer spreads due to a voltage applied between the collector and the emitter. Because of the electric field inside the depletion layer, the holes remaining in the N− type drift layer 10 reach the P+ type body contact region 16 on the upper side (the first main surface side) and are discharged from the metal emitter electrode layer 32. However, the narrower the pitch between the adjacent trenches is (that is, the closer the emitter trench electrodes 20E to which potential 0V is given are), the smaller the potential distribution of the region 10B between the trenches 60 becomes due to the field plate effect. In other words, the potential difference in Z direction between the vicinity of the P+ type body contact region 16 and the vicinity of the bottom of the trench 60 almost disappears. The deeper the trench 60 is, the smaller the potential difference of Z direction in the region 10B becomes.

Accordingly, as shown in FIG. 2A, when a pitch between the adjacent trenches 60 is narrow and the trench is deep, an electrical field in Z direction does not exist in the region 10B between the trenches. Therefore, holes are rarely swept out by a drift caused by the electric field. In fact, the holes are swept out to the metal emitter electrode layer 32 only by a diffusion current (the driving force is a distance differentiation of carrier concentration) due to a difference in carrier concentration. Accordingly, in particular, after the depletion layer has spread out, the fall in tail current component is delayed, and the turn-off loss increases.

As the external gate resistance increases, the above turn-off loss becomes more prominent. The reason is that, due to the gate resistance getting greater, when sweeping out the holes while depleting slowly, the difference in hole concentration in Z direction of the N type region 10B between the trenches is small. Accordingly, the diffusion current determined by the distance differentiation of a carrier concentration also becomes small, further delaying the fall in tail component. On the contrary, in a case where a rapid depletion occurs during the turn-off due to a small gate resistance, it is conceivable that the diffusion current gets relatively stronger because the holes rapidly gather near the trench bottom. For this reason, the fall in the tail component is relatively quick.

One solution for the above problem of increase in turn-off loss is to accelerate the turn-off by applying a minus voltage to the gate electrode. However, particularly for an in-vehicle use, there are quite a few restraints in terms of power supply, and a minus power supply cannot be adopted in many cases. Therefore, there is needed a method which can promote the discharge of holes at the time of a turn-off even when the minus power supply is not available. In the IGBT element 1 according to the present embodiment, a P type floating region 36 is provided for promoting the discharge of the holes during the turn-off.

[Hole Discharge Operation]

Figure 3:
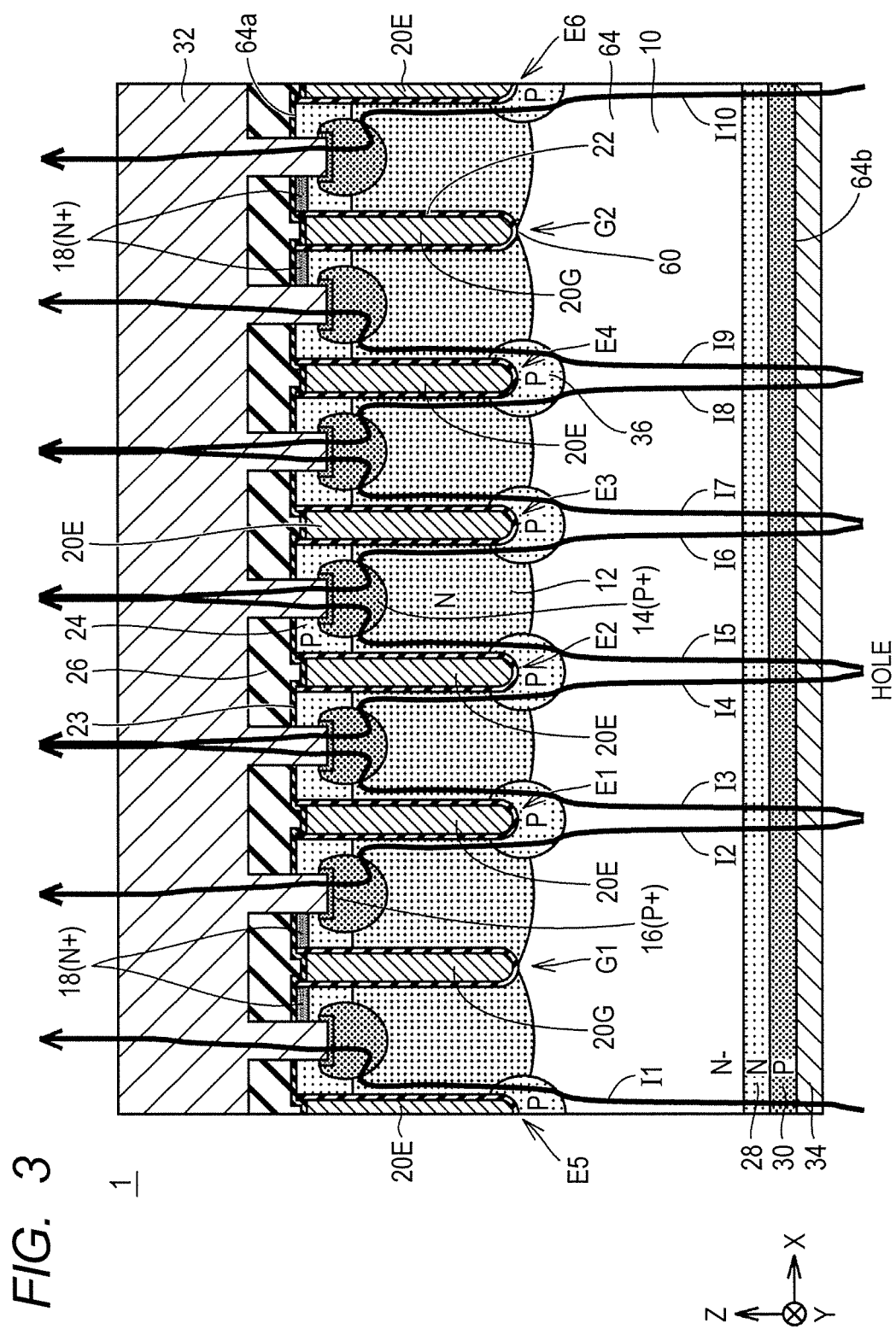
FIG. 3 illustrates a discharge operation of holes at the time of a turn-off in the IGBT element of FIG. 1.

FIG. 3 illustrates a discharge operation of holes at the time of the turn-off in the IGBT element 1 of FIG. 1. As explained with reference to FIG. 1, in the IGBT element 1, the P type floating regions 36 are provided near the bottom portions of the emitter trench electrodes 20E (trenches E1 to E6). In this case, in FIG. 3, there is configured a parasitic PMOS (P-channel Metal Oxide Semiconductor) transistor including: a P type floating region 36 as a source; an N type hole barrier layer 12 (or an N− type drift layer 10) as a channel; a P+ type latch-up preventing region 14, a P+ type body contact region 16, and a P type body layer 24 as drains; and an emitter trench electrode 20E as a gate. Specifically, in the case shown in FIG. 6, parasitic PMOS transistors are formed near side surfaces of both sides of each of the emitter trench electrodes 20E (trenches E1 to E6).

Since the holes remaining in the N− type drift layer 10 are injected into the P type floating region 36 at the time of a turn-off, the potential of the P type floating region 36 increases. That is, the potential of the source of the parasitic PMOS transistor increases. When it does so, minus potential differences occur between a gate (emitter trench electrode 20E) and a source (P type floating region 36) of the parasitic PMOS transistor, and between the drain (P+ type latch-up preventing region 14, P+ type body contact region 16, and P type body layer 24) and the source (P type floating region 36) of the parasitic PMOS transistor. As a result, the parasitic PMOS transistor is turned on, and the holes injected into the source (the P type floating region 36) of the parasitic PMOS transistor are quickly discharged into the drains (the P+ type latch-up preventing region 14, the P+ type body contact region 16, and the P type body layer 24) of the parasitic PMOS transistor. That is, hole currents I1 to I10 flow through the parasitic PMOS transistor of the on-state in the route shown by an arrow of the solid line in FIG. 3.

Thus, in addition to the hole discharge function made possible by the inner electric field of the depletion layer which spreads during the off state, the IGBT element 1 of First Embodiment has a hole discharge function by a parasitic PMOS transistor. In this case, as compared to a depth of the trench, a pitch of the trench is narrow. Therefore, even when the inner electric field of the depletion layer does not exist in a region between the trenches, it is possible to promote the discharge of the holes which are left-over carriers at the time of the turn-off. It can be considered that the more likely the depletion layer spreads during the off time of the IGBT element, the more prominent the hole discharge function due to the parasitic PMOS transistor becomes. Therefore, it is conceivable that the higher the resistivity of the N− type semiconductor substrate 64 (N− type drift layer 10) is (that is, the lower the impurity concentration is), the more likely the above function is exhibited.

Incidentally, the P type floating regions 36 are not provided near bottom portions of the trenches G1 and G2 where the gate trench electrodes 20G are embedded. The reasons are as follows.

The first reason is that, while the IGBT element 1 is in an on state, the flow of electrons should not be disturbed when the electrons are injected into the N− type drift layer 10 passing through the N channel in the P type body layer 24 from the N+ type emitter region 18. The narrower the pitch of the trench becomes, the more likely the flow of the electrons is disturbed.

The second reason is that, even if the parasitic PMOS transistor is configured by providing P type floating layers 36 near the bottom portions of the trenches G1 and G2, a minus potential difference is less likely to occur between the gate (gate trench electrode 20G) and the source (P type floating region 36) of the parasitic PMOS transistor. The reason is that, since the gate potential in place of the emitter potential is given to the gate trench electrode 20G, during the turn-off of the IGBT element 1, there occurs a delay for the gate trench electrode 20G to return to a 0V-state.

Therefore, it is apparent that the P type floating region 36 of the present embodiment is completely different from the P type floating region (see, for example, Japanese Unexamined Patent Application Publication (Translation of PCT Application) No. 2003-520430 [Patent Document 3]), which is provided near the bottom portion of the gate trench electrode to avoid electric field concentration.

<Manufacturing Method of IGBT Element>

Hereafter, with reference to cross-sectional views in FIGS. 4 to 22 showing manufacturing steps and the flowchart of FIG. 23, a method of manufacturing the IGBT element shown in FIG. 1 will be explained.

Figure 23:
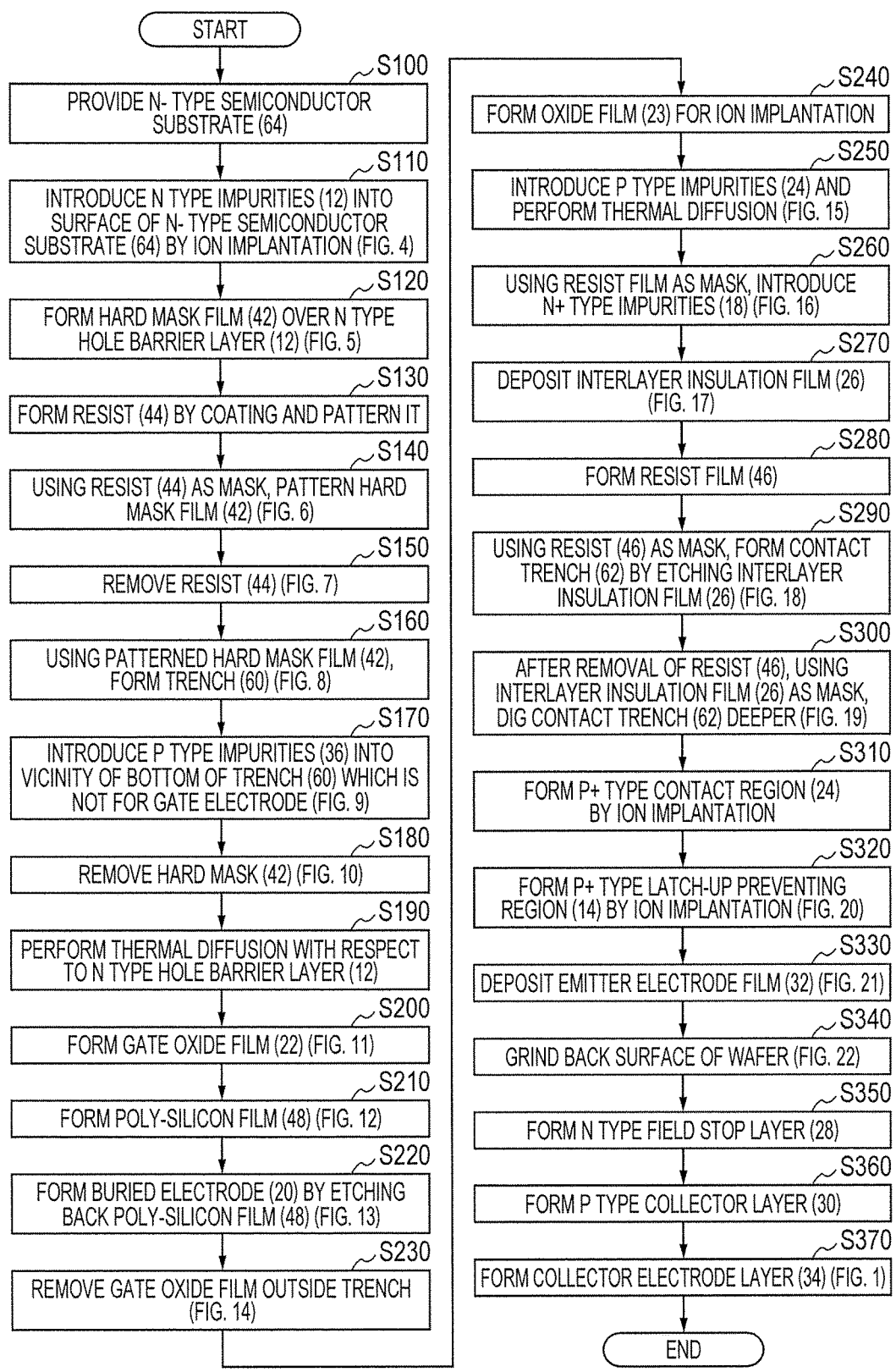
FIG. 23 is a flowchart showing manufacturing steps of the IGBT element in FIG. 1.

First, an N− type single crystal silicon wafer 64 is provided (step S100 in FIG. 23). In order to give it an N− type property, the single crystal silicon is doped with, for example, phosphorus of about $2 \times 10^{14}/cm^3$. The single crystal silicon wafer is formed by, for example, an FZ (Floating Zone) method or a CZ (Czochralski) method. The N− type wafer 64 is used mainly as the N− type drift layer 10 of FIG. 1.

Figure 4:
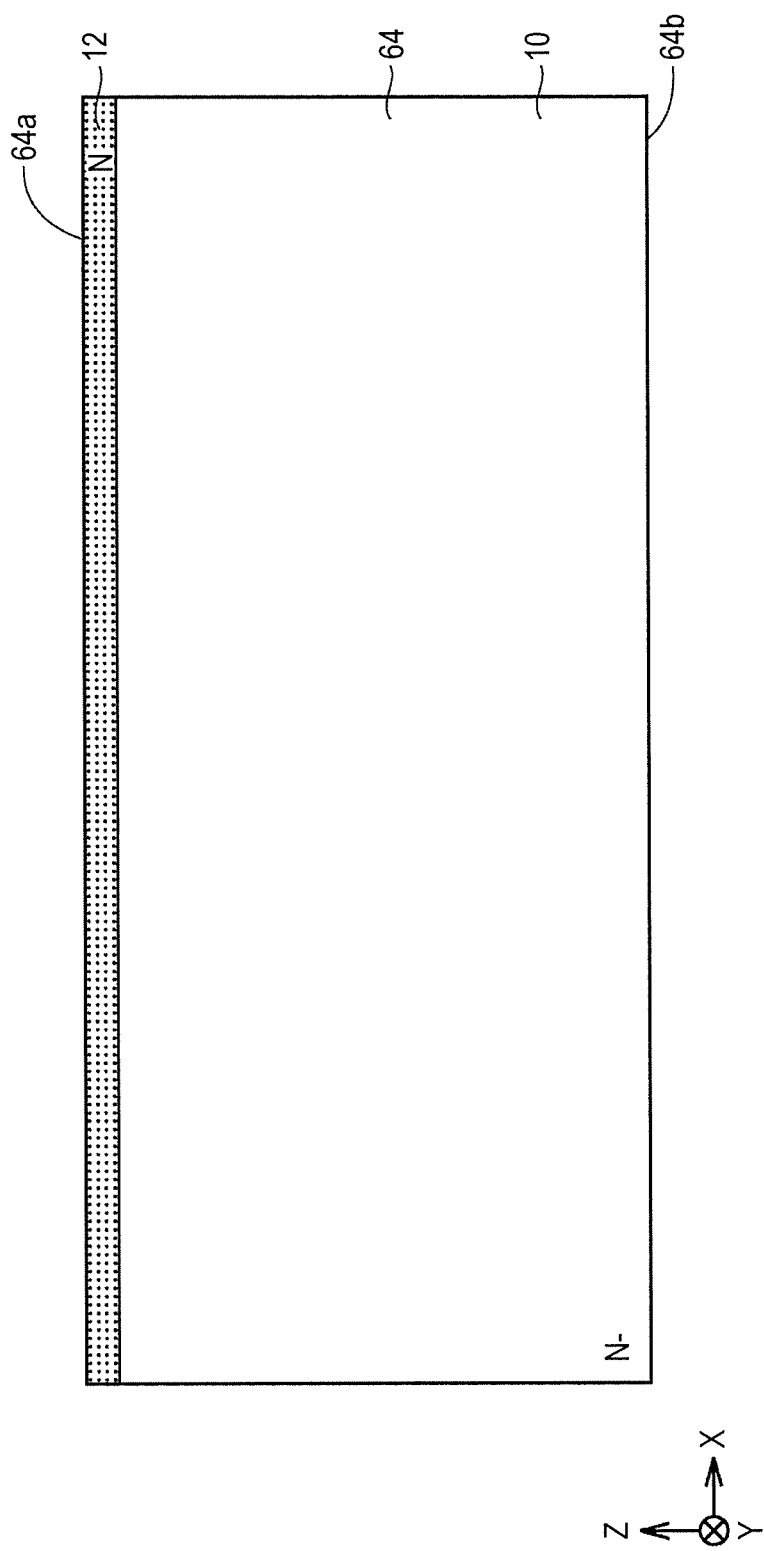
FIG. 4 is a cross-sectional view in a manufacturing step of the IGBT element after forming an N type hole barrier layer.

Next, as shown in FIG. 4 (step S110), by ion implantation, an N type hole barrier layer 12 is formed by introducing N type impurities into the first main surface 64a of the semiconductor wafer (also referred to as a "semiconductor substrate." However, at this stage, the N type hole barrier layer 12 is not diffused in Z direction. The ion implantation conditions at this time are: for example, ion species: phosphorus, dose amount: about $6 \times 10^{12}/cm^2$, and implantation energy: about 80 KeV.

Figure 5:
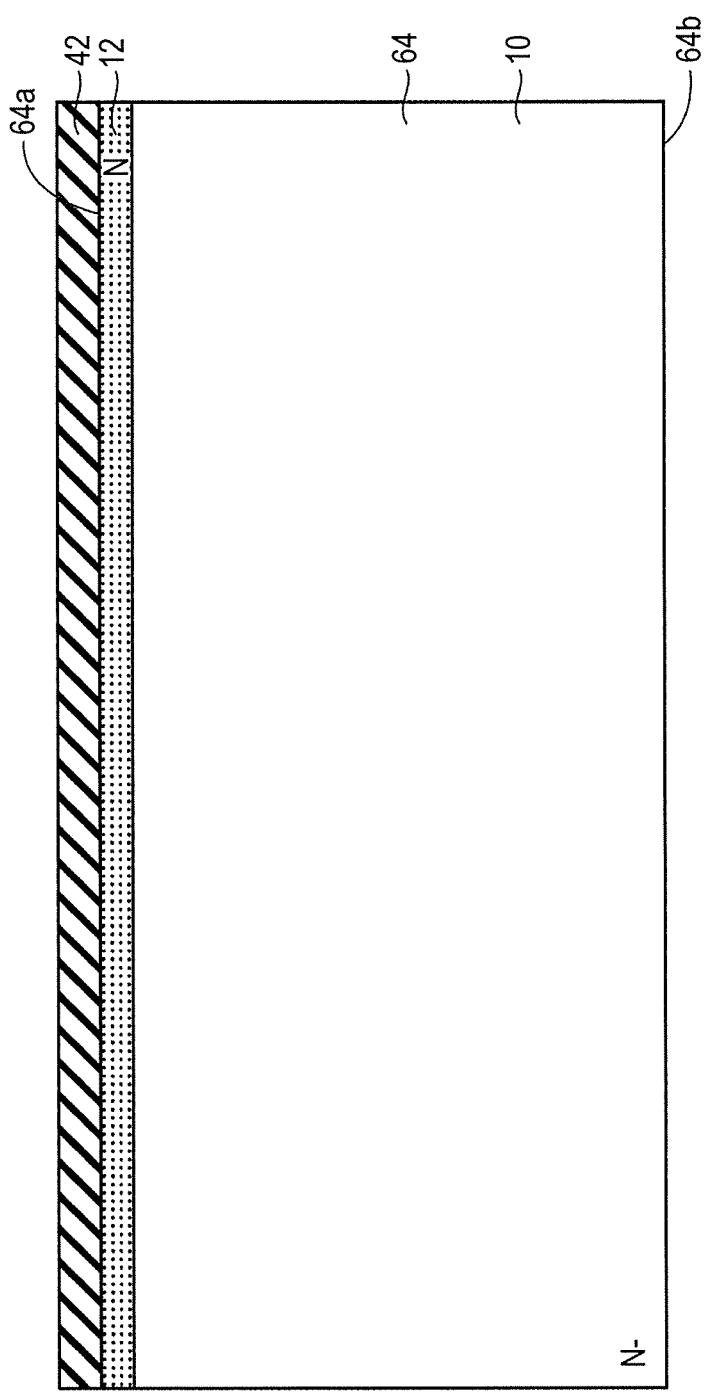
FIG. 5 is a cross-sectional view in a manufacturing step of the IGBT element after forming a trench forming hard mask film.

Next, as shown in FIG. 5 (step S120), over almost the entire first main surface 64a of the semiconductor wafer 64, for example, by CVD (Chemical Vapor Deposition) or the like, there is deposited a trench forming hard mask film 42 using a material such as silicon oxide type insulation film (the thickness is, for example, about 450 nm).

Next, over almost the entire upper surface of the hard mask film 42, a trench hard mask film processing resist film 44 is formed by coating or the like, and the resist film 44 is patterned by general lithography (step S130).

Figure 6:
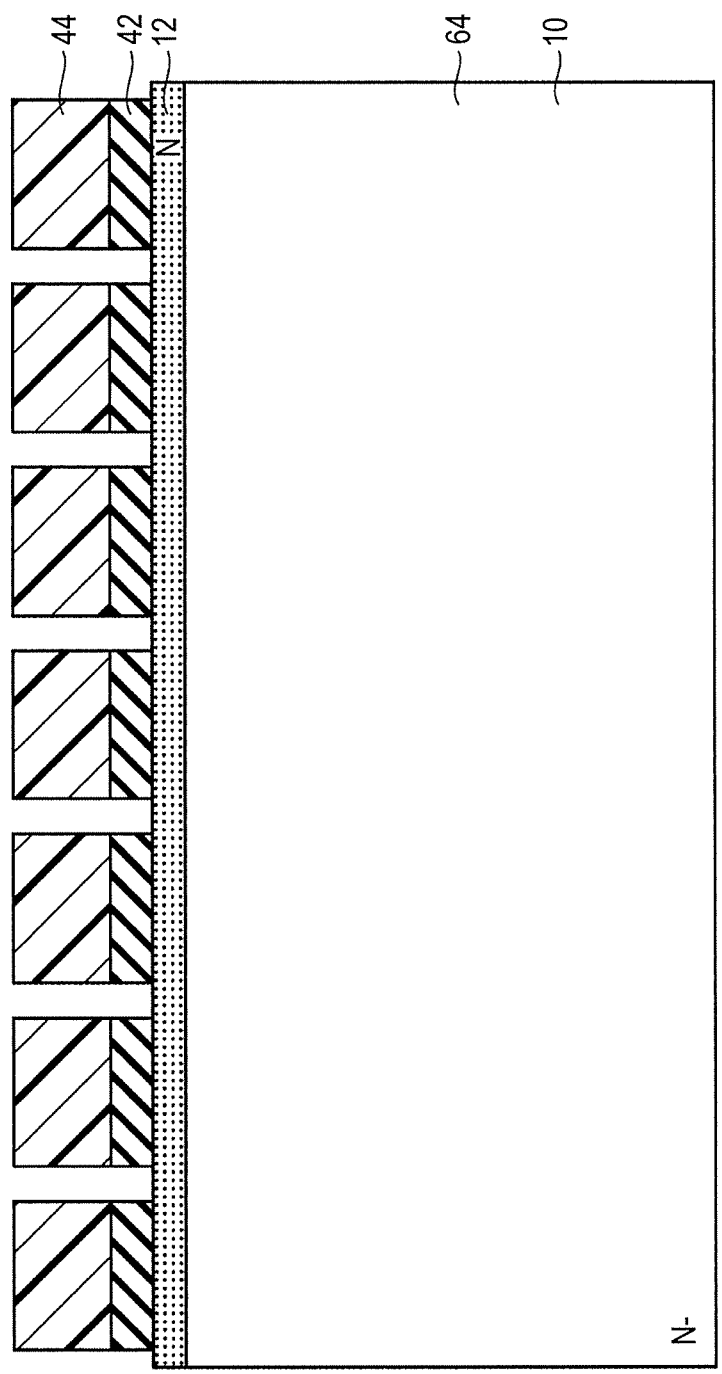
FIG. 6 is a cross-sectional view in a manufacturing step of the IGBT element showing a state where a trench hard mask film processing resist film is formed.

Next, as shown in FIG. 6 (step S140), using the patterned trench hard mask film processing resist film 44 as a mask, for example, by dry etching, the trench forming hard mask film 42 is patterned.

Figure 7:
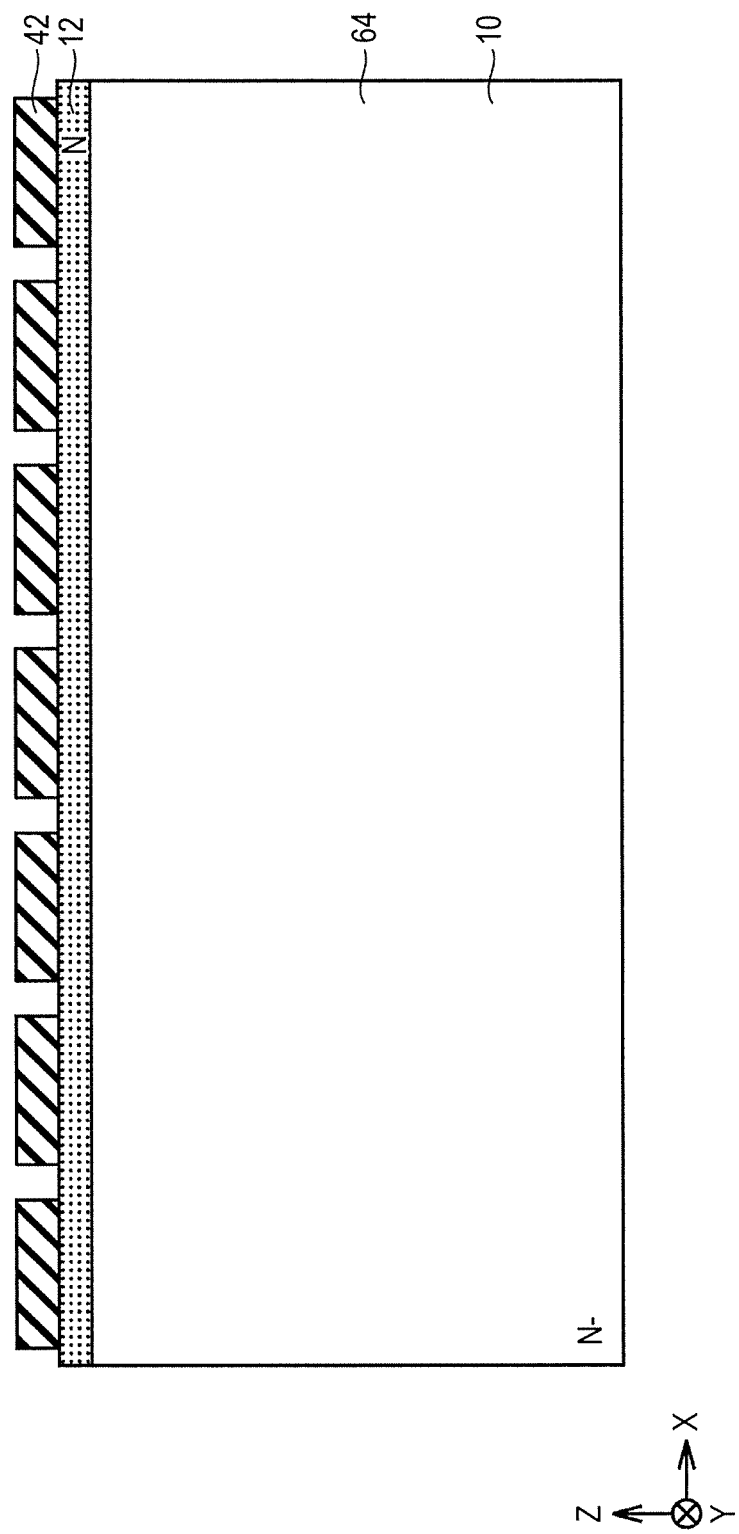
FIG. 7 is a cross-sectional view in a manufacturing step of the IGBT element after processing the trench forming hard mask film.

Then, as shown in FIG. 7 (step S150), the resist film 44 which has become unnecessary is removed by ashing or the like.

Figure 8:
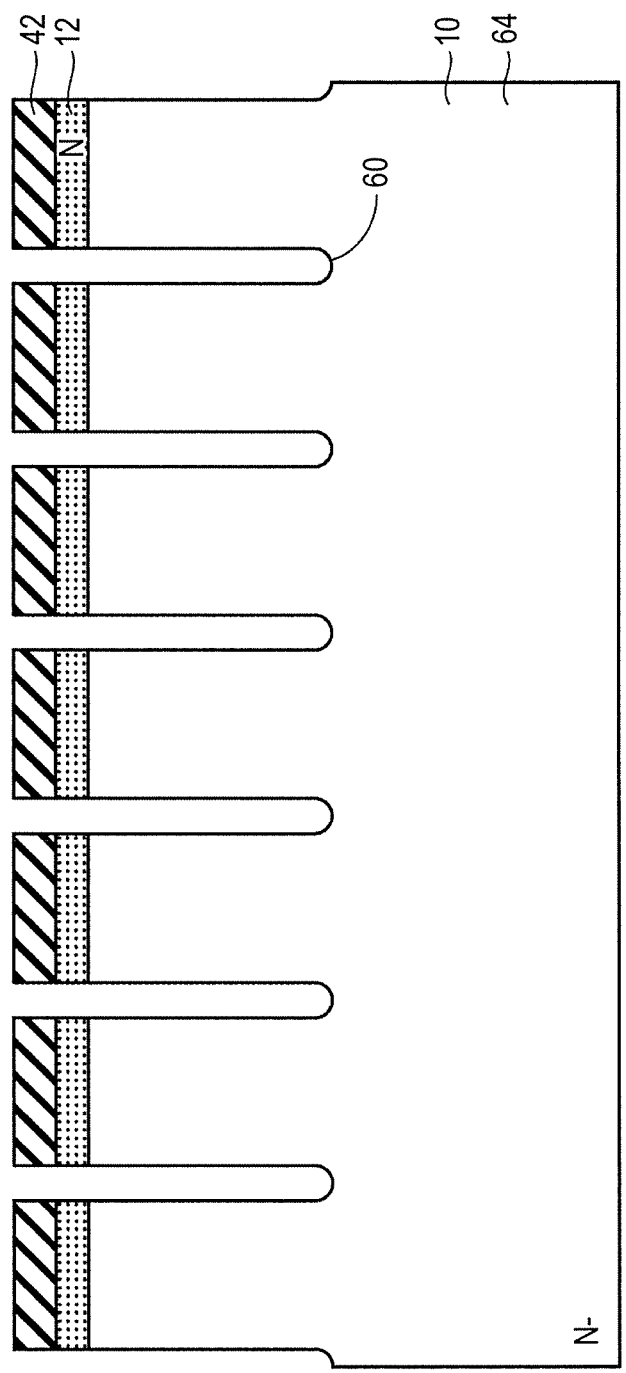
FIG. 8 is a cross-sectional view in a manufacturing step of the IGBT element after forming a trench.

Next, as shown in FIG. 8 (step S160), using the patterned trench forming hard mask film 42, a trench 60 is formed by, for example, anisotropic dry etching. As the gas type for the anisotropic dry etching, for example, $SF_6/O_2$ type gases, $Cl_2/O_2$ type gases, or HBr type gases can be used.

Figure 9:
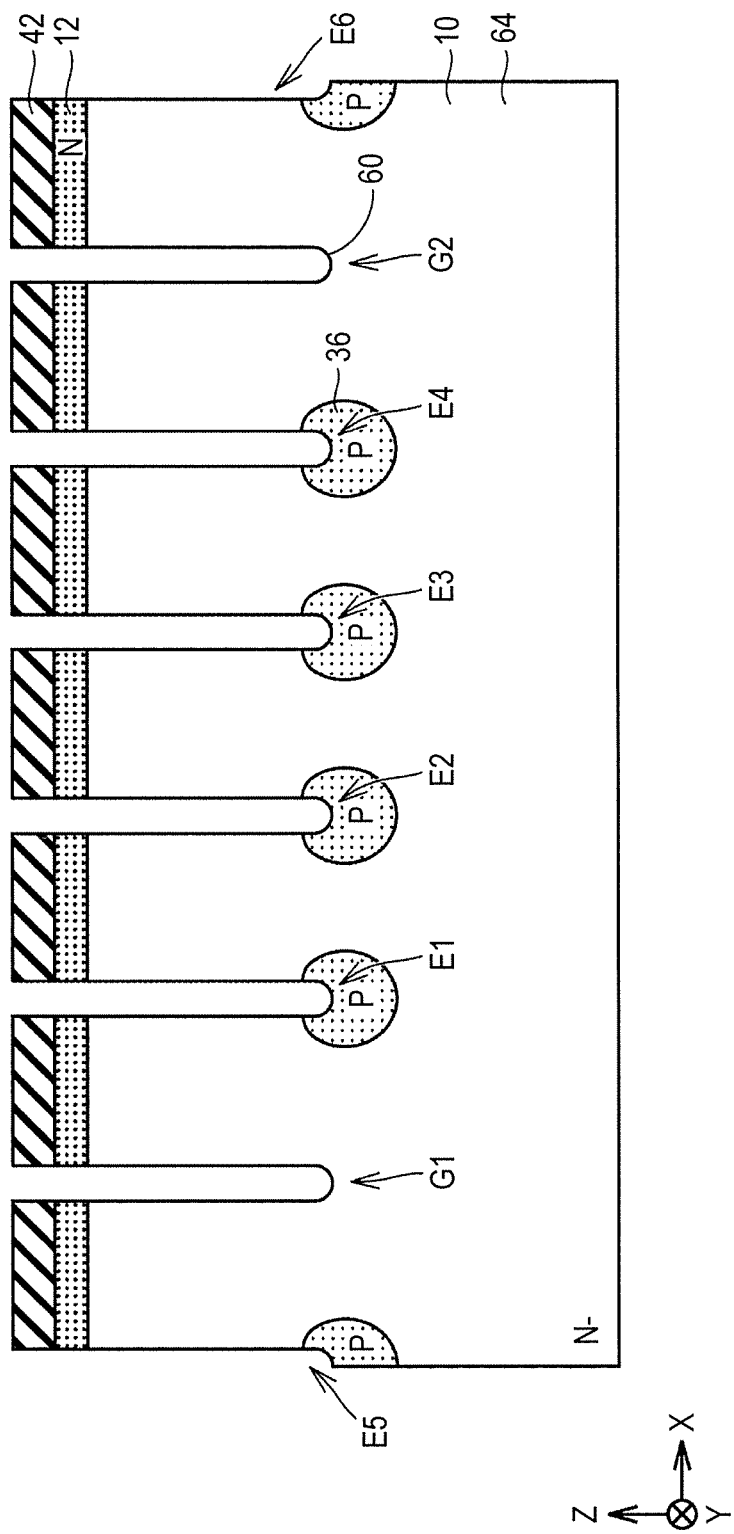
FIG. 9 is a cross-sectional view in a manufacturing step of the IGBT element after forming a P type floating region.

Subsequently, as shown in FIG. 9 (step S170), by ion implantation using the trench forming hard mask film 42, there is formed a P type floating region 36 near the bottom surfaces of the trenches (where the gate trench electrode 20G is not formed) 60 (E1 to E6) for the emitter trench electrode 20E. The implantation conditions are: for example, ion species: boron, dose amount: about $1 \times 10^{13}/cm^2$, and implantation energy: about 30 KeV. The trench 60 for the gate trench electrode 20G is, for example, masked with a resist (not shown). In a drawing showing a step subsequent to step S170, the P type floating region 36 is not shown. However, in the case of First to Third Embodiments, the P type floating region 36 is formed at this stage.

Figure 10:
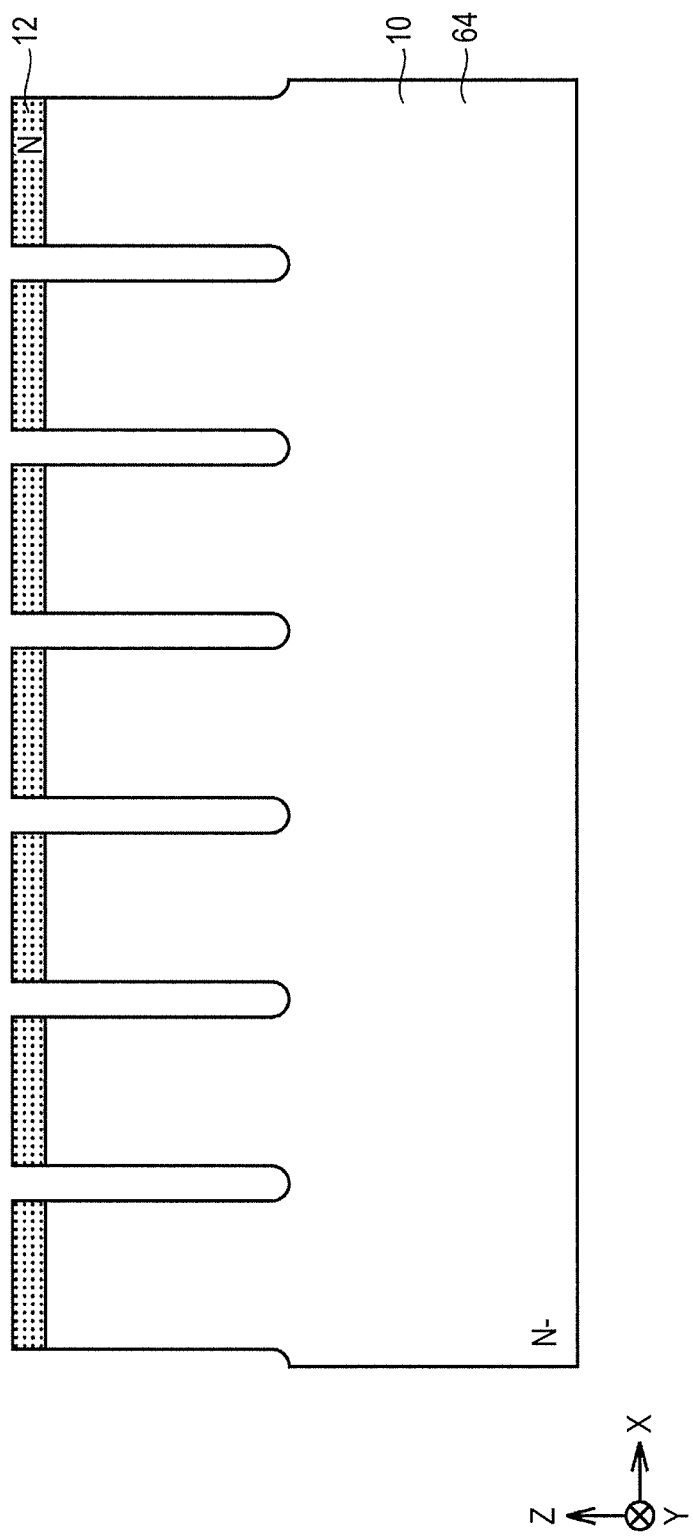
FIG. 10 is a cross-sectional view in a manufacturing step of the IGBT element after removing the trench forming hard mask film.

Then, as shown in FIG. 10 (step S180), by wet etching using, for example, a hydrofluoric acid type silicon oxide film etchant or the like, there is removed the trench forming hard mask film 42 which has become unnecessary.

Next, after forming a sacrificial oxide film over the surface, the N type hole barrier layer 12 is subjected to a drive-in diffusion (step S190) (For example, 1200 degrees centigrade, about 30 minutes). However, the thermal load may be greater depending on a depth of the trench.

Figure 11:
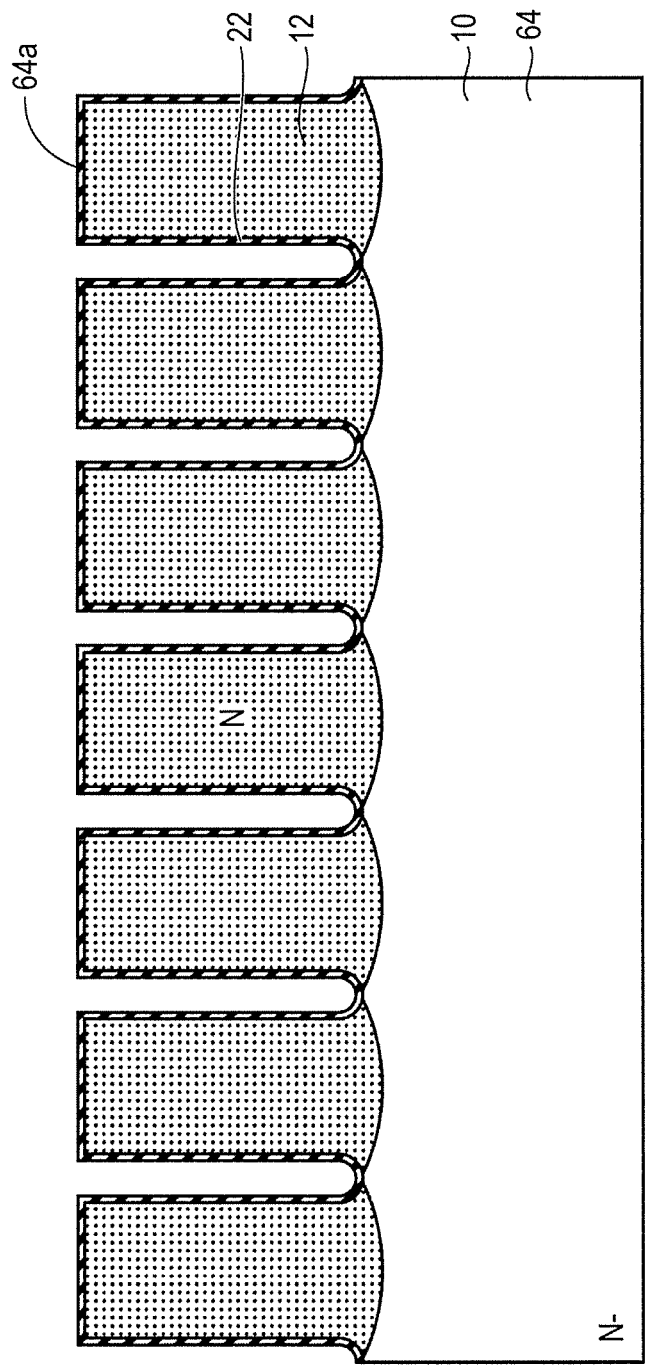
FIG. 11 is a cross-sectional view in a manufacturing step of the IGBT element showing a state where a drive-in diffusion of the N type hole barrier layer is carried out and, then, a gate oxide film is formed.

Then, after removing the sacrificial oxide film, by thermal oxidation or the like, over almost the entire first main surface 64a of the semiconductor wafer 64 and the inner surface of the trench 60, there is formed a gate insulation film 22 (the thickness is, for example, about 120 nm) (step S200). As a result, a cross-sectional form shown in FIG. 11 is obtained.

Figure 12:
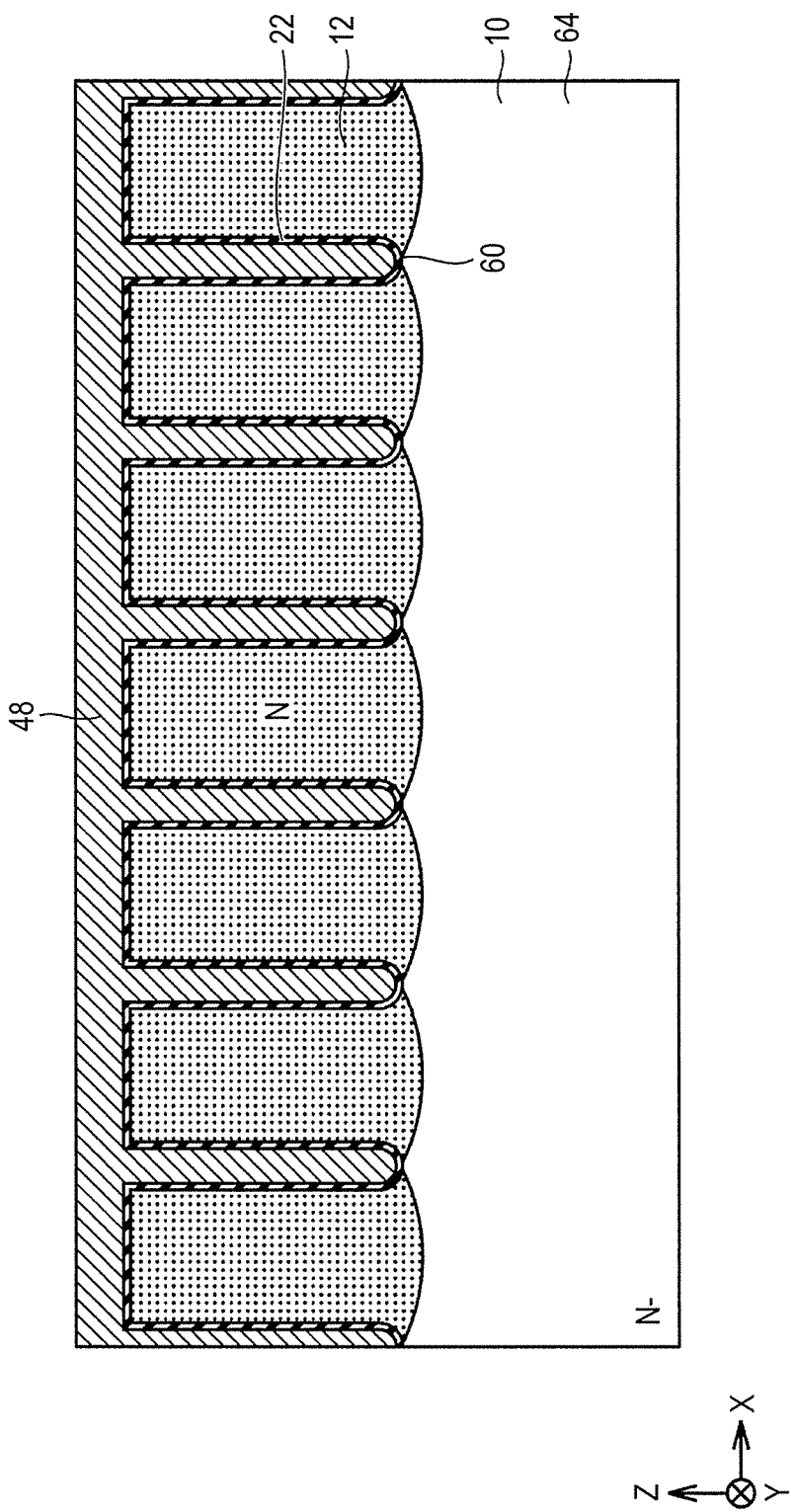
FIG. 12 is a cross-sectional view in a manufacturing step of the IGBT element after a doped poly-silicon film for a buried electrode is deposited.

Next, as shown in FIG. 12 (step S210), a poly-silicon film 48 doped with phosphorus (the thickness is, for example, about 600 nm) is deposited, by for example, CVD or the like, over almost the entire surface of the gate insulation film 22 in such a manner as to fill the trench 60.

Figure 13:
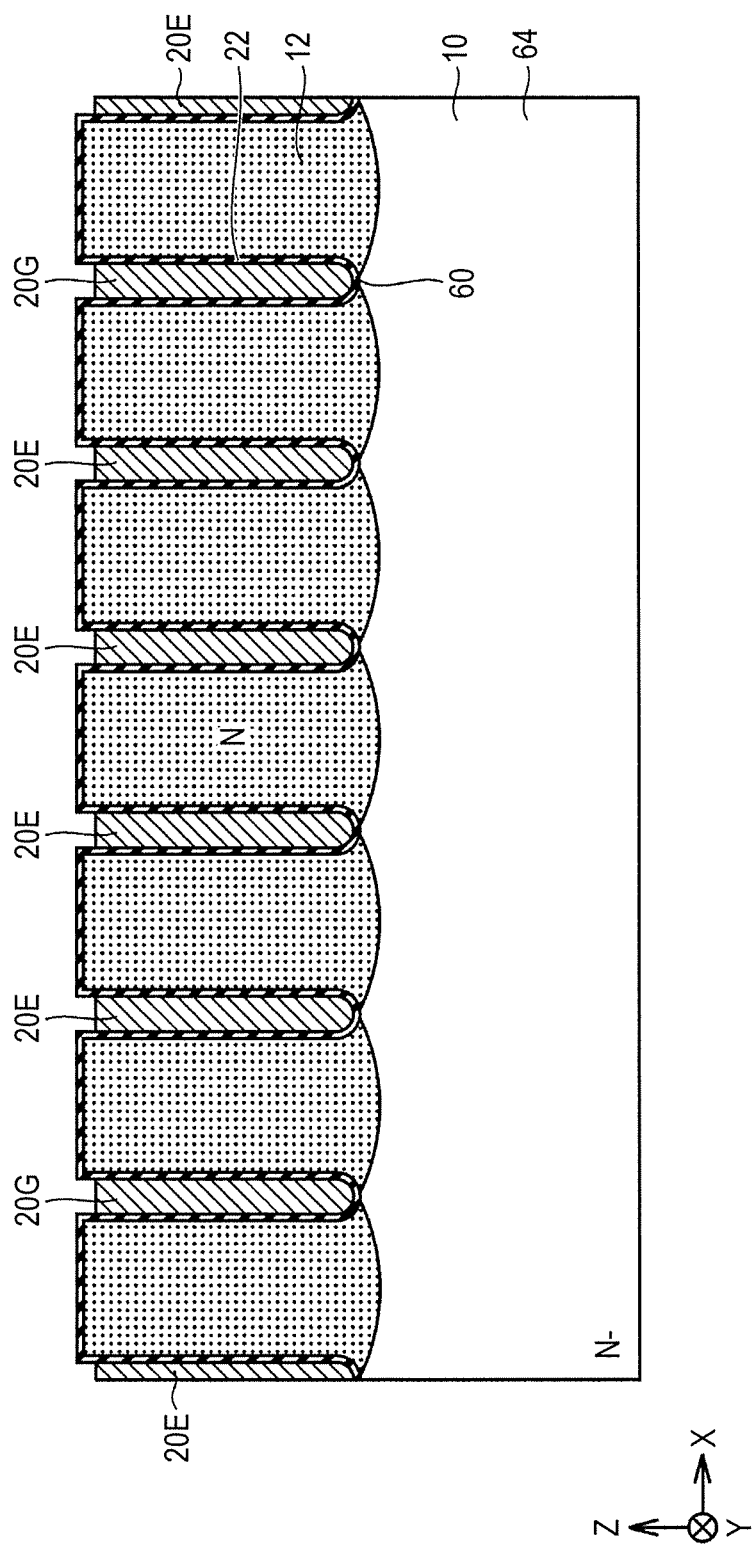
FIG. 13 is a cross-sectional view in a manufacturing step of the IGBT element after the doped poly-silicon film is subjected to etching back.

Next, as shown in FIG. 13 (step S220), for example, by dry etching or the like (for example, gas type being $SF_6$), the poly-silicon film 48 is etched back, thereby to form buried electrodes 20 (agate trench electrode 20G and an emitter trench electrode 20E) in the trench 60.

Figure 14:
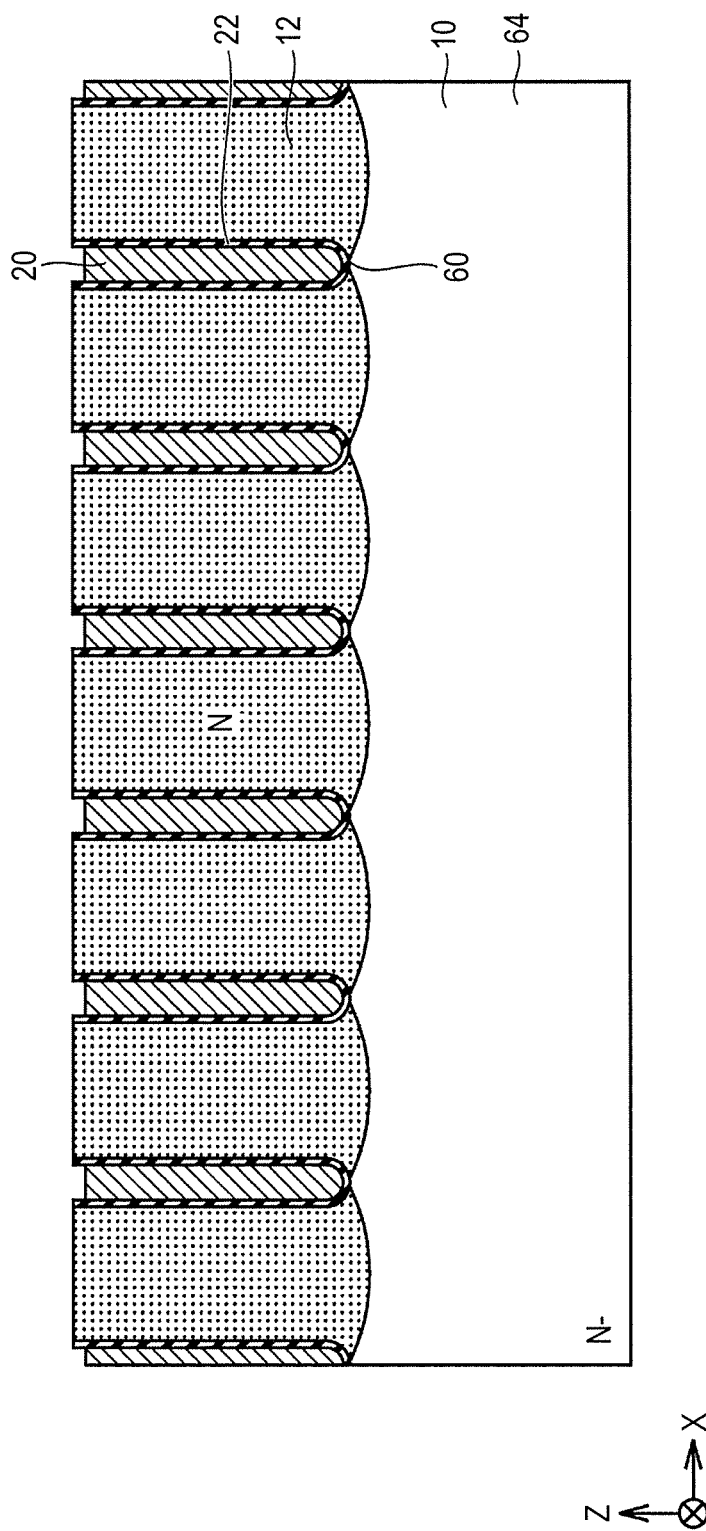
FIG. 14 is a cross-sectional view in a manufacturing step of the IGBT element after removing a gate insulation film outside the trench.
Figure 15:
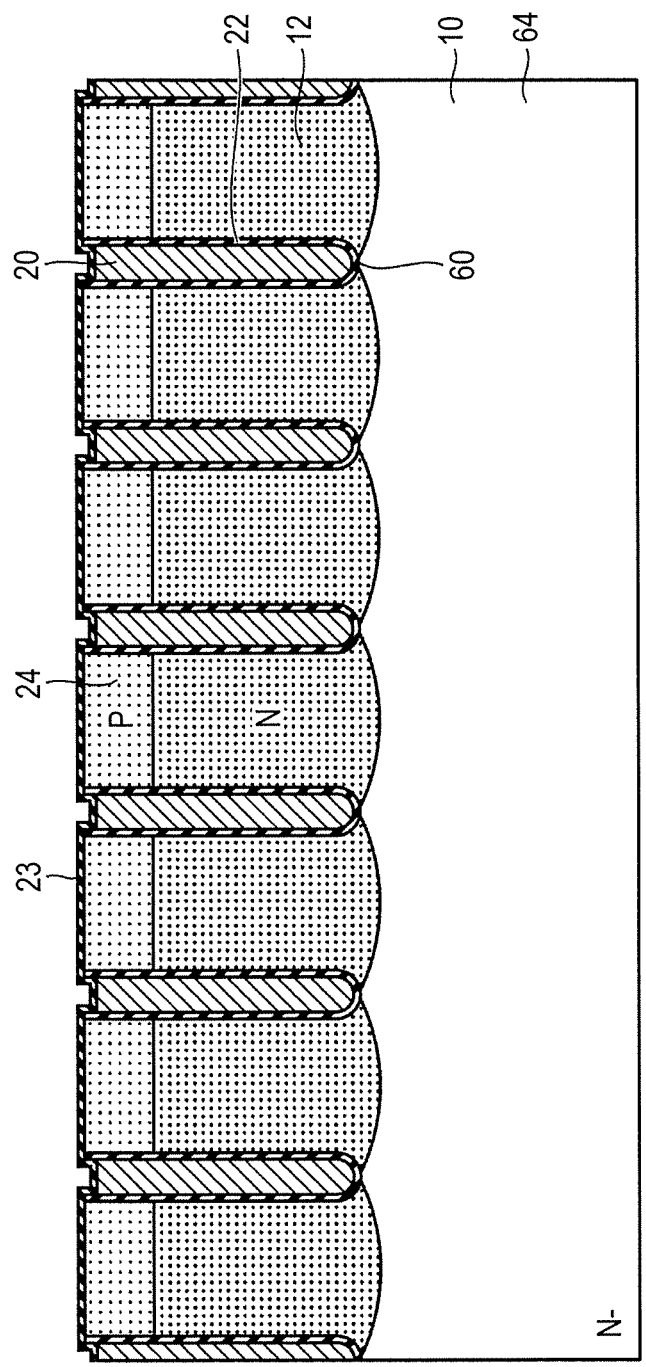
FIG. 15 is a cross-sectional view in a manufacturing step of the IGBT element showing a state where a P type body layer is formed by ion implantation after forming an oxide film for ion implantation.

Next, as shown in FIG. 14 (step S230), by wet etching using, for example, a hydrofluoric acid type silicon oxide film etchant or the like, the gate insulation film 22 outside the trench 60 is removed.

Next, for example, by thermal oxidation or CVD, over almost the entire first main surface 64a of the semiconductor wafer 64, there is formed (step S240) a relatively thin silicon oxidize film 23 (for example, about the same thickness as that of the gate insulation film) for subsequent ion implantation.

Then, over the first main surface 64a of the semiconductor wafer 64, a P type body layer 24 introducing resist film (not shown) is formed by general lithography. Using the P type body layer 24 introducing resist film as a mask, by ion implantation, P type impurities are introduced into almost the entire surface of the cell formation region (region between trenches) and, then, by thermal diffusion, a P type body layer 24 is formed (step S250). The ion implantation conditions at this time are: for example, ion species: boron, dose amount: about $3\times10^{13}/cm^2$, and implantation energy: about 75 KeV. Then, the resist film (not shown) which has become unnecessary is removed by ashing or the like to obtain a cross-sectional form shown in FIG. 15.

Figure 16:
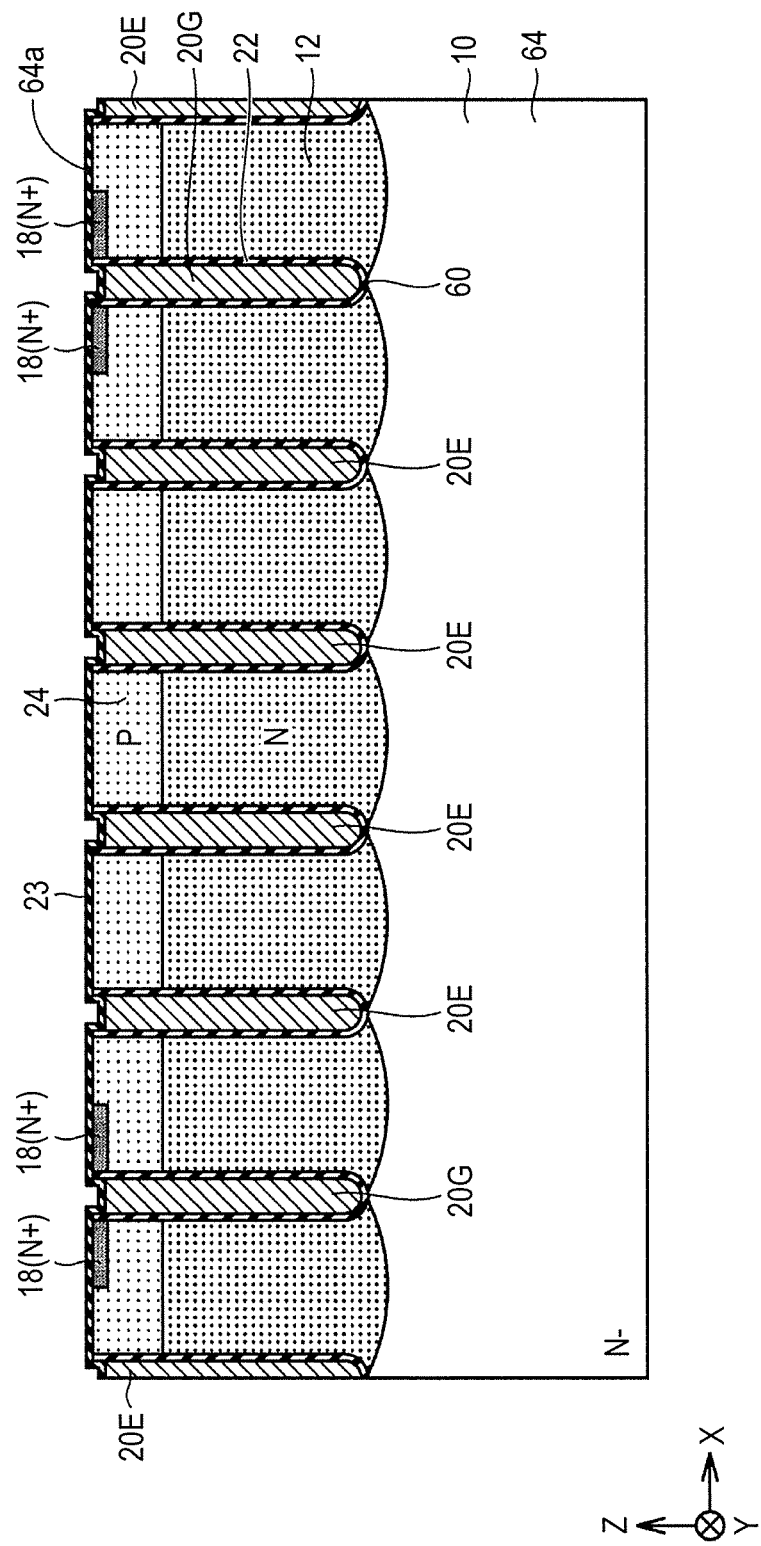
FIG. 16 is a cross-sectional view in a manufacturing step of the IGBT element after forming an N+ type emitter region.

Next, over the first main surface 64*a* of the semiconductor wafer 64, an N+ type emitter region 18 introducing resist film (not shown) is formed by general lithography. Using the N+ type emitter region 18 introducing resist film as a mask, by ion implantation, N type impurities are introduced (step S260) into a portion adjacent to the trench 60, in which the gate trench electrode 20G is embedded, of the upper surface of the P type body layer 24, thereby to form the N+ type emitter region 18. The ion implantation conditions are: for example, ion species: arsenic, dose amount: about $5\times10^{15}/cm^2$, and implantation energy: about 80 KeV. Then, the resist film which has become unnecessary is removed by ashing or the like to obtain a cross-sectional form shown in FIG. 16 is obtained.

Figure 17:
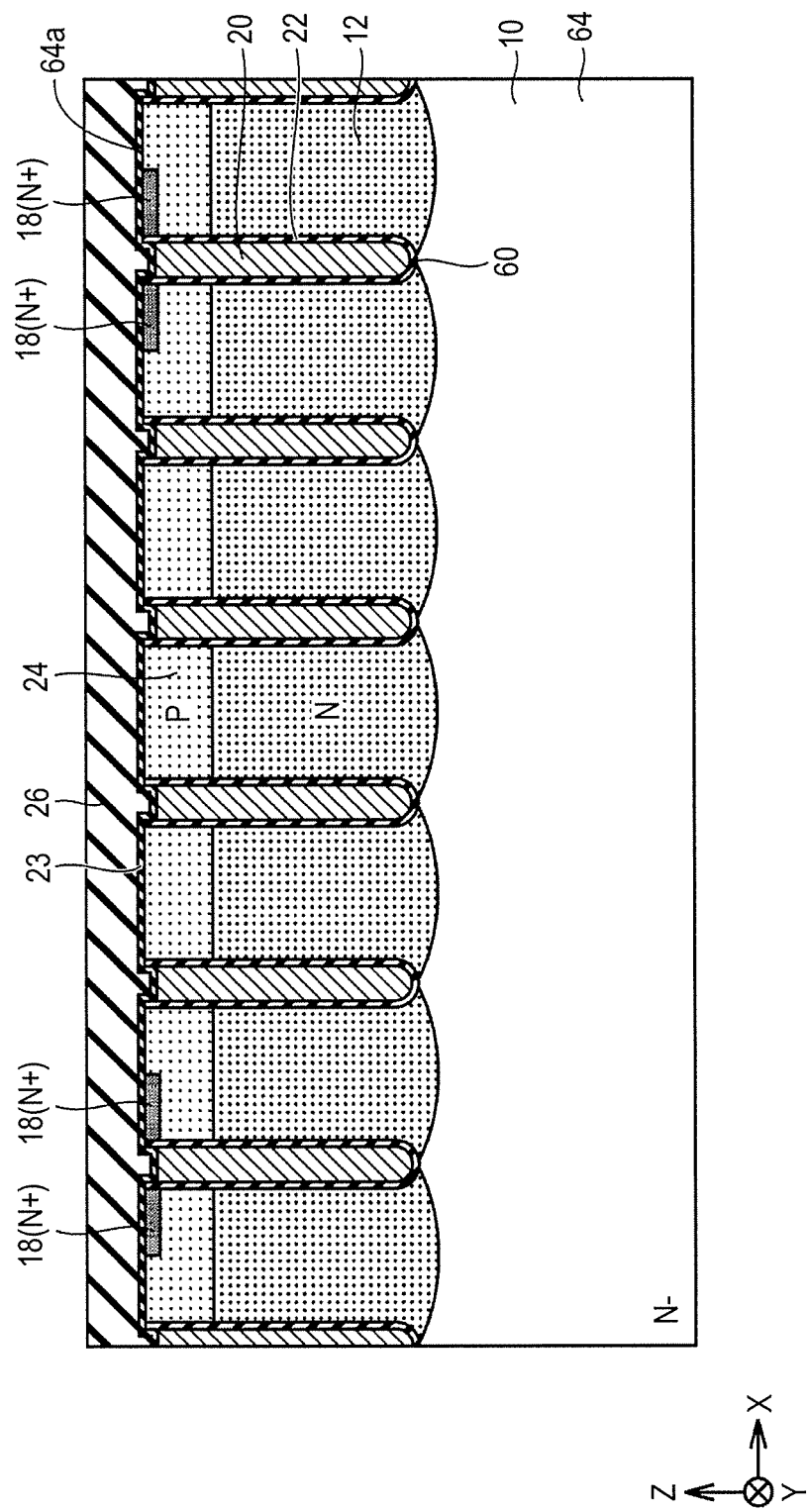
FIG. 17 is a cross-sectional view in a manufacturing step of the IGBT element after forming an interlayer insulation film.

Next, as shown in FIG. 17 (step S270), over almost entire surface of the first main surface 64*a* of the semiconductor wafer 64, for example, by CVD, coating, or the like, as an interlayer insulation layer 26, there is deposited, for example, a PSG (Phosphsilicate Glass) film of about 600 nm thick. Examples of the material for the interlayer insulation film 26 may include, other than the PSG film, a BPSG (Borophosphsilicate Glass) film, an NSG (Non-doped Silicate Glass) film, and an SOG (Spin-On-Glass) film, or composite films thereof.

Next, over the interlayer insulation film 26, a contact trench forming resist film 46 is formed by general lithography (step S280).

Figure 18:
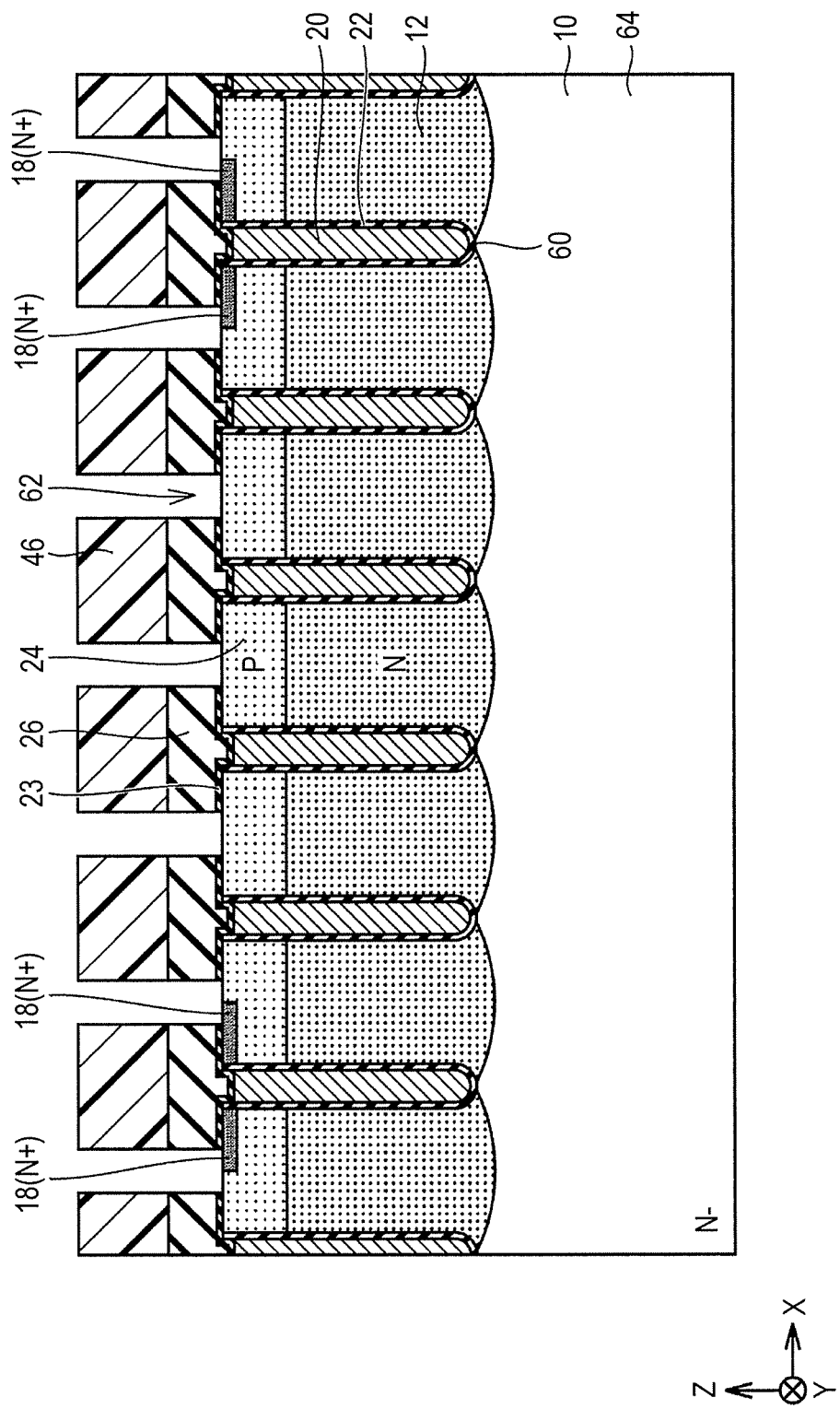
FIG. 18 is a cross-sectional view in a manufacturing step of the IGBT element showing a state where a contact trench is formed in the interlayer insulation layer using a patterned resist as a mask.

Then, as shown in FIG. 18 (step S290), for example, by anisotropic dry etching or the like (gas type being, for example, $Ar/CHF_3/CF_4$ or the like), a contact trench 62 (or a contact hole) is formed.

Then, the resist film 46 which has become unnecessary is removed by ashing or the like. Then, as shown in FIG. 19 (step S300), for example, by anisotropic dry etching, the contact trench 62 (or a contact hole) is dug deep to the inside of the P type body layer 24. A gas type used at this time can be, for example, $Cl_2/O_2$.

Next, by ion implantation, P type impurities are introduced through the contact trench 62 to form a P+ type body contact region 16 (step S310). The ion implantation conditions at this time are: for example, ion species: $BF_2$, dose amount: about $5\times10^{15}/cm^2$, and implantation energy: about 80 KeV.

Figure 20:
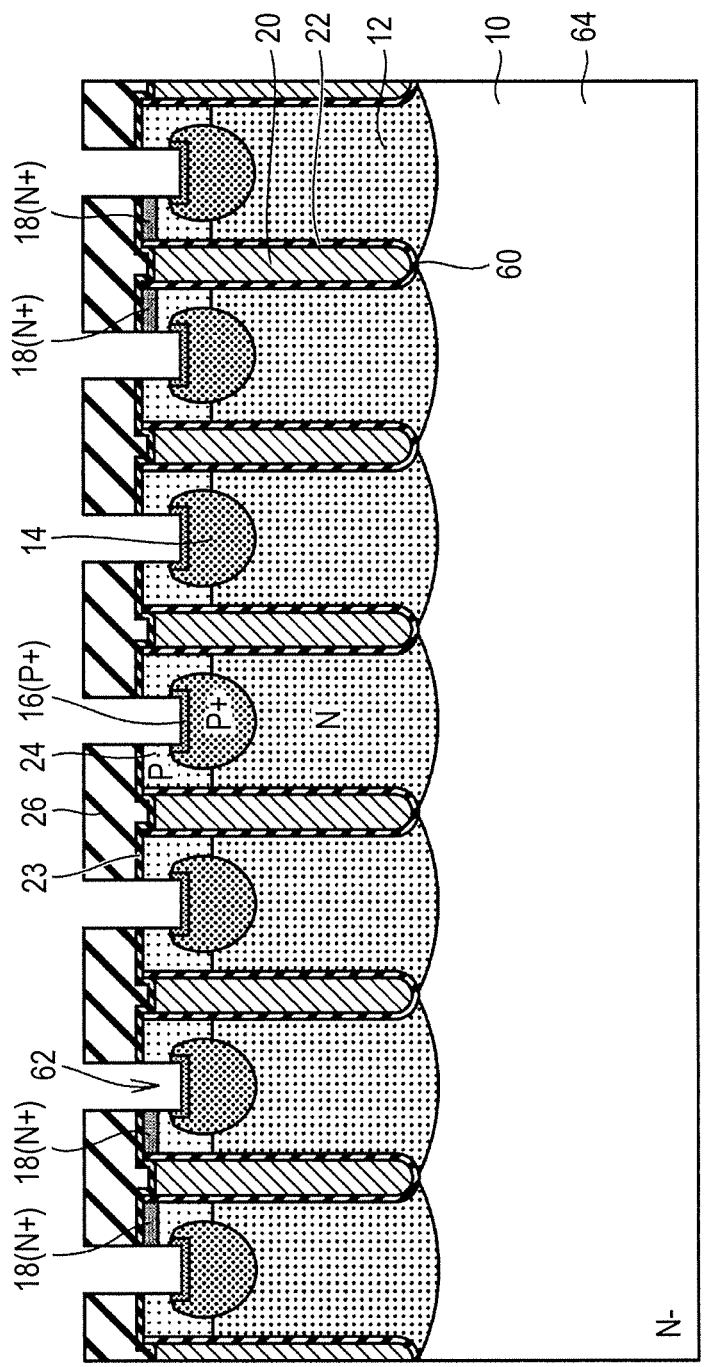
FIG. 20 is a cross-sectional view in a manufacturing step of the IGBT element after forming a P+ type body contact region and a P+ type latch-up preventing region.

Further, by ion implantation, P type impurities are introduced through the contact trench 62 to form a P+ type latch-up preventing region 14 (step S320). As a result, a cross-sectional form shown in FIG. 20 is obtained. The ion implantation conditions at this time are: for example, ion species: boron, dose amount: about $5\times10^{15}/cm^2$, and implantation energy: about 80 KeV.

Figure 21:
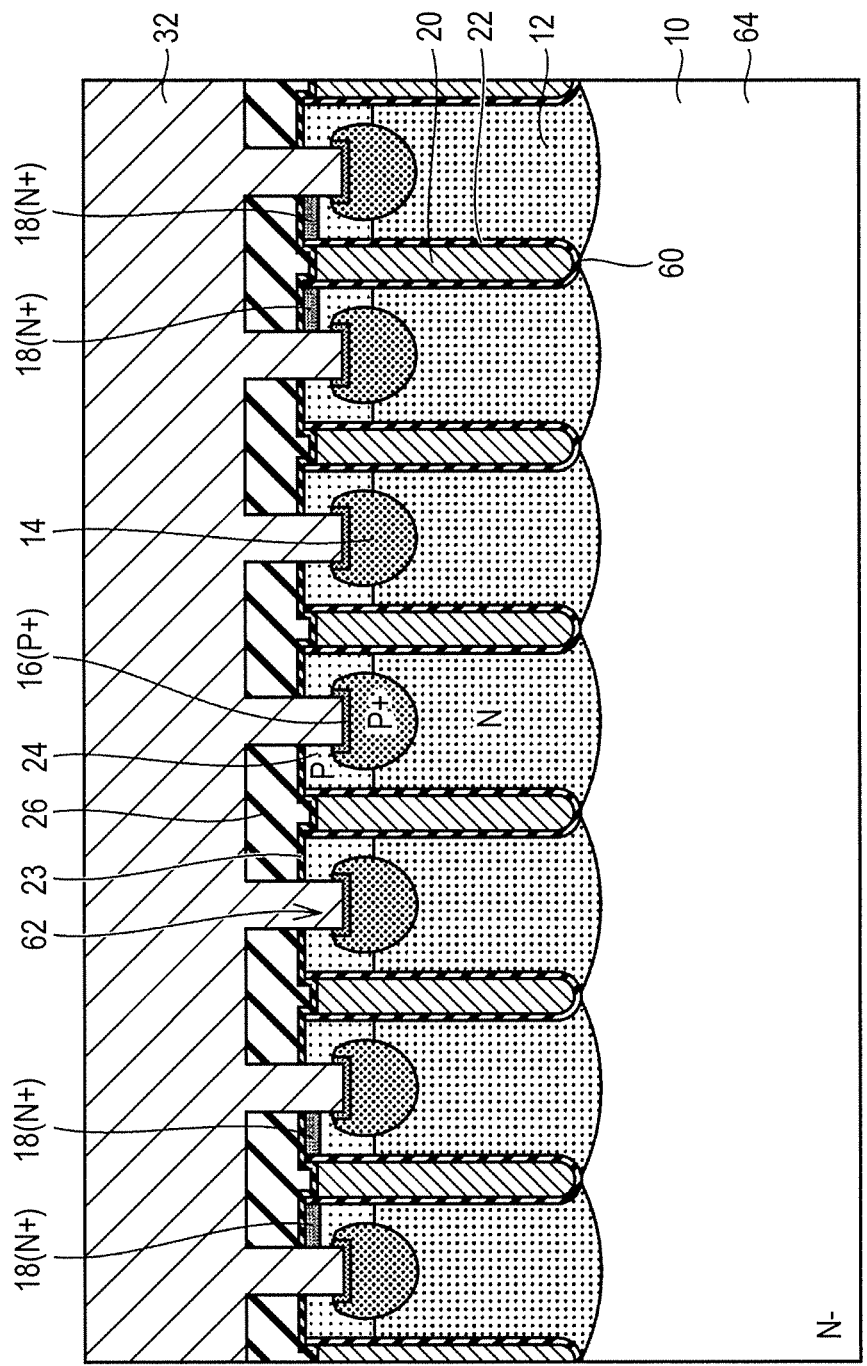
FIG. 21 is a cross-sectional view in a manufacturing step of the IGBT element after forming a metal emitter electrode layer.

Next, as shown in FIG. 21 (step S330), by sputtering or the like, for example, there is formed an aluminum type electrode film to be used as a metal emitter electrode layer 32. Specifically, first, for example, by sputtering deposition, over almost the entire interlayer insulation layer 26 and the contact trench 62, as a barrier metal film, there is formed a TiW film (the thickness is, for example, about 200 nm). Subsequently, for example, about 10-minute silicide annealing is carried out in a nitrogen atmosphere at about 600 degrees centigrade. As a result, a large portion of titanium in the TiW film moves to the silicon interface to form silicide, which contributes to the improvement of the contact characteristics. Subsequently, over almost the entire barrier metal film, an aluminum type metal film containing aluminum as a principal component (for example, silicon added in an amount of several percent, and the balance being aluminum), for example, with a thickness of about 5 micrometers, is formed in such a manner as to fill the contact trench 62, for example, by sputtering. Then, in order to provide a bonding pad or the like (not shown), the aluminum type metal electrode film is patterned by general lithography and etching or the like.

Figure 22:
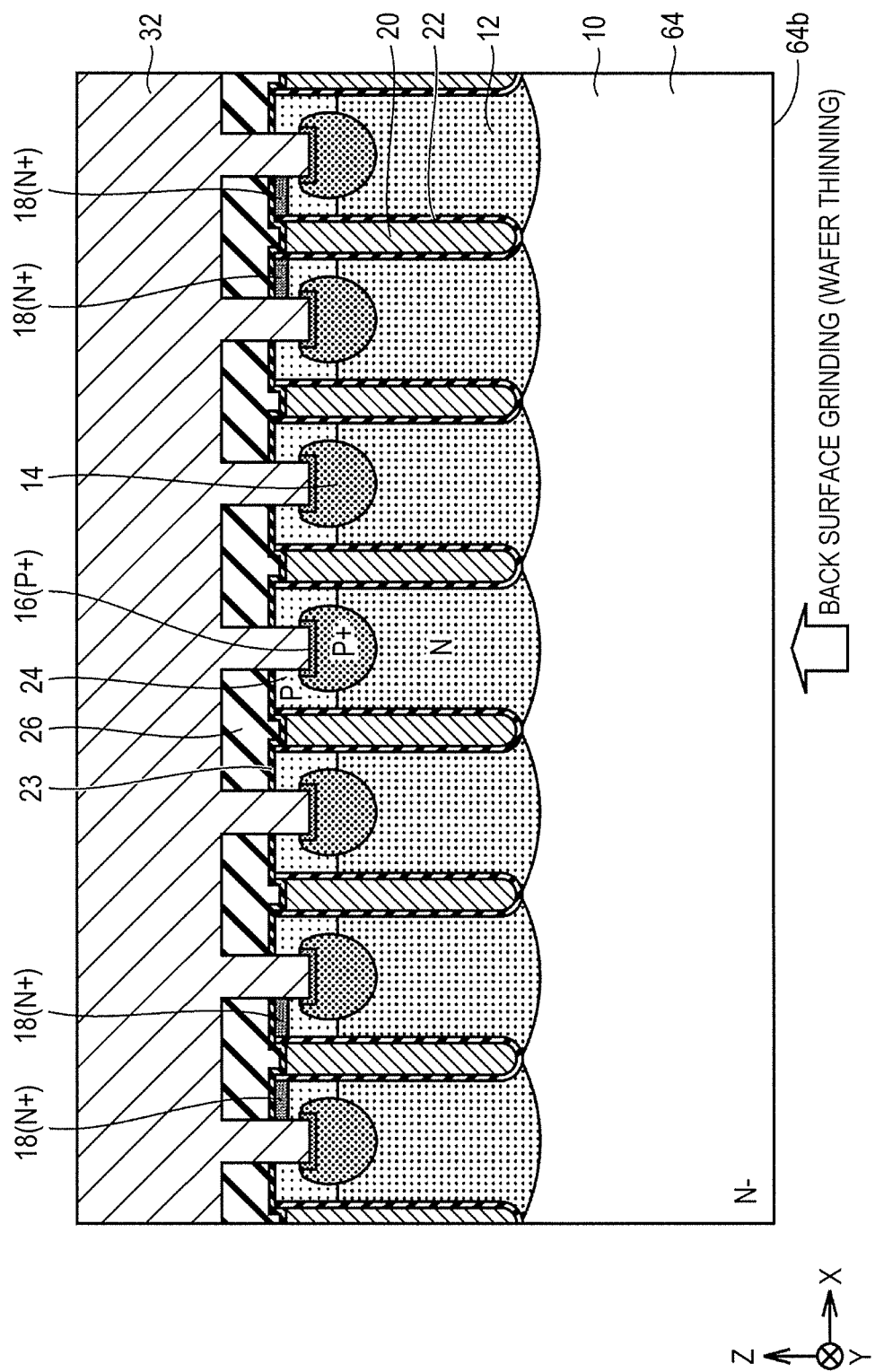
FIG. 22 is a cross-sectional view illustrating a back grinding of the semiconductor substrate.

Next, as shown in FIG. 22 (step S340), a first surface side of the wafer 64 is protected with use of a tape or the like (not shown), and the second main surface (back surface) 64*b* of the wafer 64 is subjected to a grinding treatment. If necessary, chemical etching or the like for removing the damage of the back surface is also carried out. As a result, the film thickness of the silicon substrate 64 is made to a thickness corresponding to the withstand voltage. For example, in the case of an original wafer thickness of about 800 μm, a final wafer is reduced to about 70 μm when the withstand voltage is about 600 volts and, when the withstand voltage is about 1200 volts, a final wafer thickness is about 180 μm.

Subsequently, N type impurities are introduced into almost the entire surface of the back surface 64*b* of the semiconductor wafer 64 (10), for example, by ion implantation, thereby to form an N type field stop layer 28 (step S350). At this time, the ion implantation conditions are: for example, ion species: phosphorus, dose amount: about $7\times10^{12}/cm^2$, and implantation energy: about 350 KeV. Then, if necessary, for impurity activation, the back surface 64*b* of the wafer 64 is subjected to laser annealing or the like.

Next, by ion implantation, for example, P type impurities are introduced into almost the entire surface of the second main surface 64*b* of the semiconductor wafer 64 to form a P type collector layer 30 (step S360). At this time, the ion implantation conditions are: for example, ion species: boron, dose amount: about $1\times10^{13}/cm^2$, and implantation energy: about 40 KeV. Then, if necessary, for impurity activation, the back surface 64*b* of the wafer 64 is subjected to laser annealing or the like.

Next, for example, by sputtering deposition, a metal collector electrode 34 is formed (step S370) over almost the entire surface of the second main surface 64*b* of the semiconductor wafer 64 to obtain a cross-sectional form shown in FIG. 1. Then, by dicing or the like, division into the chip regions of the semiconductor wafer 64 is performed and, if necessary, sealing in a package is performed, completing the IGBT element 1.

[Effects]

As described above, in the IGBT element 1 according to First Embodiment, the P type floating regions 36 are provided near the bottom portions of the emitter trench electrodes 20E (trenches E1 to E6). As a result, there is configured the parasitic PMOS transistor including: the P type floating region 36 as a source; the N type hole barrier layer 12 (or the N− type drift layer 10) as a channel; the P+ type latch-up preventing region 14, the P+ type body contact region 16, and the P type body layer 24 as drains; and the emitter trench electrode 20E as the gate. Since the remaining holes of the N− type drift layer 10 are injected into the P type floating region 36 at the time of a turn-off, the parasitic PMOS transistor is turned on, promoting the discharge of the holes. Therefore, even when the pitch between the trenches is narrowed in order to reduce the on-state voltage, the hole discharge function can be maintained, realizing the semiconductor device provided with the IGBT element which has features of a low on-state voltage and a high-speed turn-off.

<Second Embodiment>

Figure 24:
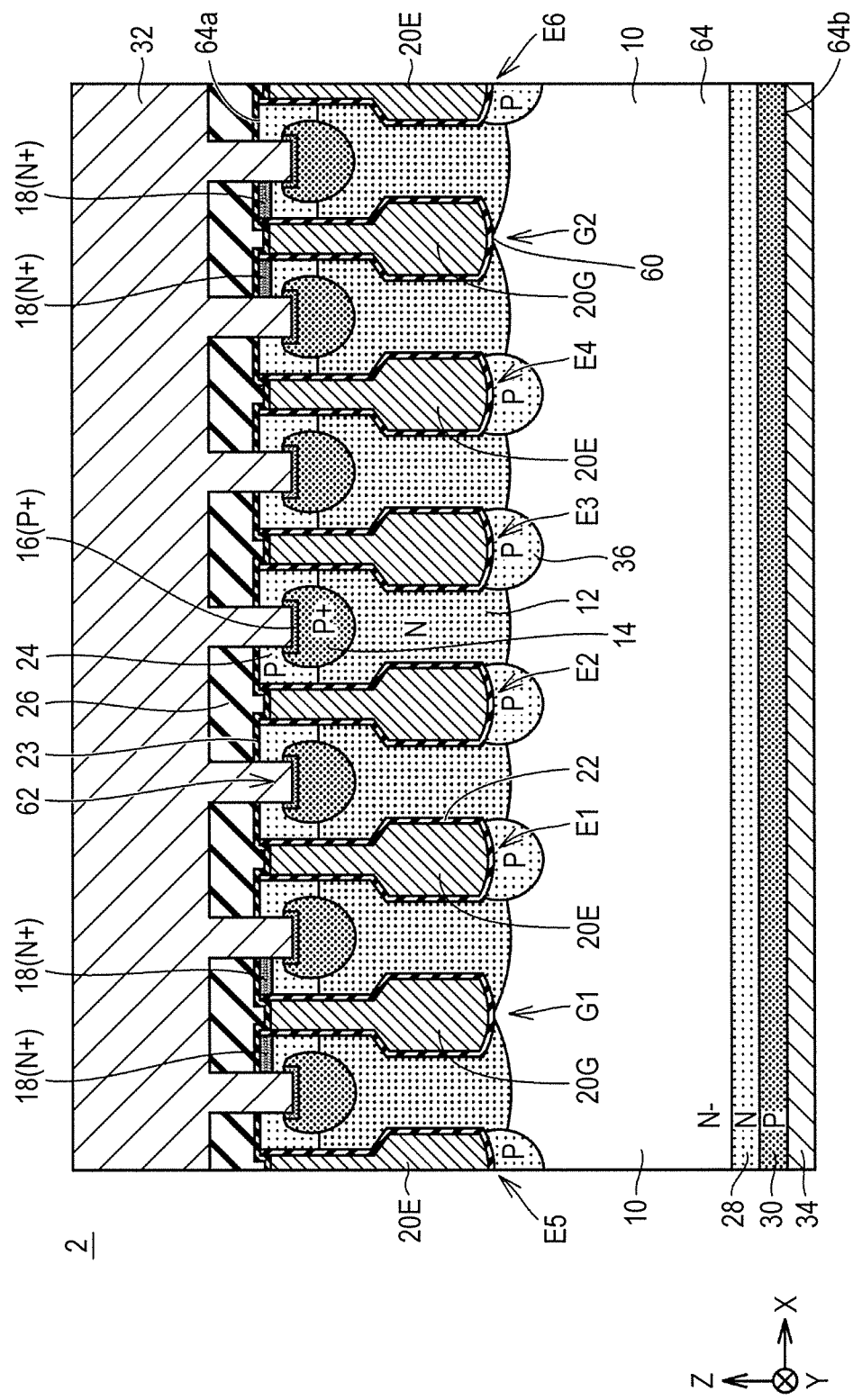
FIG. 24 is a cross-sectional view showing a configuration of an IGBT element according to Second Embodiment.

FIG. 24 is a cross-sectional view showing a configuration of an IGBT element 2 according to Second Embodiment. The cross-sectional view of FIG. 24 corresponds to the cross-sectional view of FIG. 1.

In the IGBT element 2 of FIG. 24, a width (a length in X direction of FIG. 1) of each trench is not uniform, and each trench has a portion broader than other portions (there may be a plurality of broad portions). In the broad portion, a spacing (mesa width) between adjacent trenches is narrow. As a result, a hole current does not flow easily in an on state, enhancing a hole accumulation effect in the N-drift layer 10, which brings about an effect of lowering an on-state voltage.

According to the above configuration, the spacing (mesa width) between the adjacent trenches can be narrowed without changing the pitch of the trench. Generally, in order to narrow the pitch between the trenches, processing accuracy by photolithography must be raised. However, in the IGBT element 2 of the above configuration, the effect similar to the one in First Embodiment can be achieved without raising the processing accuracy.

To be specific, in the case shown in FIG. 24, a portion near the bottom of each trench 60 is wider than a portion near an entrance thereof. That is, a cross-section of each trench 60 is in the shape of a sake bottle as in Non-patent Document 1. Since the configuration except the shape of the trench 60 in FIG. 24 is the same as that of the case in FIG. 1, the same or similar parts are denoted by the same reference characters and description thereof is not repeated.

Figure 25:
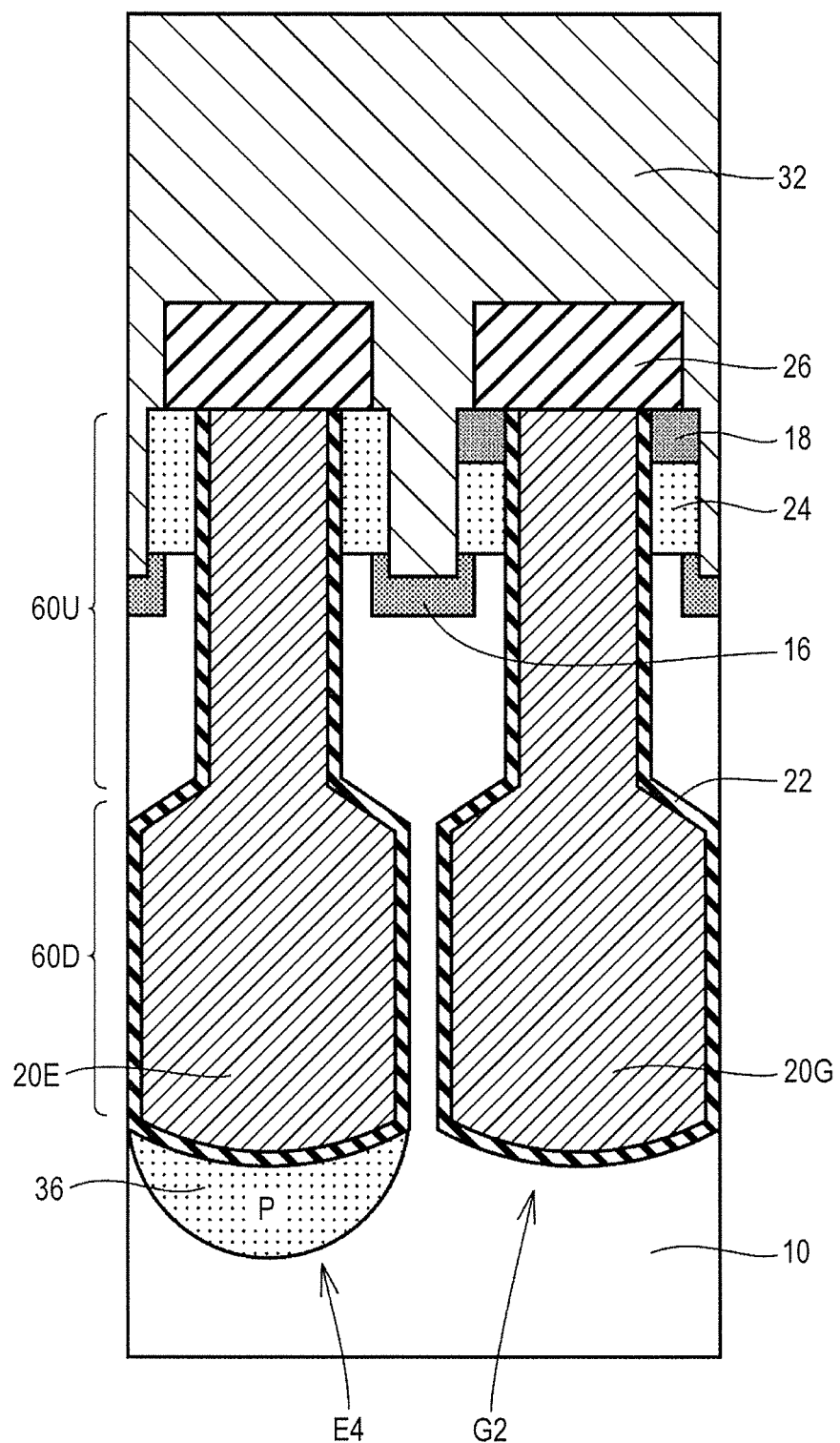
FIG. 25 is a cross-sectional view in which portions of trenches E4 and G2 are enlarged.

FIG. 25 is a cross-sectional view in which portions of the trenches E4 and G2 shown in FIG. 24 are enlarged. In the cross-sectional view of FIG. 25, the N type hole barrier layer 12 and the P+ type latch-up preventing region 14 shown in FIG. 24 are not provided. Further, in the cross-sectional view of FIG. 25, the cross-sectional forms of the trenches E4 and G2 are shown in an emphasized manner.

Now, a brief description will be made as to one example of a method of manufacturing a trench electrode whose cross-sectional form is shown in FIG. 25. First, an upper half portion 60U of the trench is formed (at this point, a lower half portion 60D of the trench is not formed). Then, an inner surface of the upper half portion 60U is coated with a silicon nitride film. After the trench is dug into the lower half portion 60D, there is formed a thick oxide film (to be a sacrificial oxide film) by thermal oxidization over the inner surface of the trench. At this time, since the upper half portion 60U is masked with a nitride film, a silicon thermally oxidized film 60U is not formed. Subsequently, after removing the silicon nitride film and the thermally oxidized film (sacrificial oxide film), agate oxide film is formed over the inner surface of the trench (both the upper half 60U and the lower half 60D). Next, by installing the trench electrode inside the trench, a trench electrode in the cross-sectional form shown in FIG. 25 is completed.

<Third Embodiment>

An IGBT element 3 of Third Embodiment is characteristic in that, in order to prevent the fracture of the element, arrangement of the P type floating region 36 is made different from that of the IGBT element 1 according to First Embodiment. Hereafter, with reference to FIG. 3, a problem of the arrangement of the P type floating regions 36 in First Embodiment will be described.

[Problem of IGBT Element in FIG. 3]

The problem in the case shown in FIG. 3 is the presence of hole currents I1, I2, I9, and I10 which pass through the P+ type body contact regions 16 provided on both sides of the gate trench electrodes 20G (trenches G1 and G2) and flow into a metal emitter electrode layer 32 from the N– type drift layer 10. Hereafter, an explanation thereof will be given with reference to an equivalent circuit of the IGBT element shown in FIG. 26.

Figure 26:
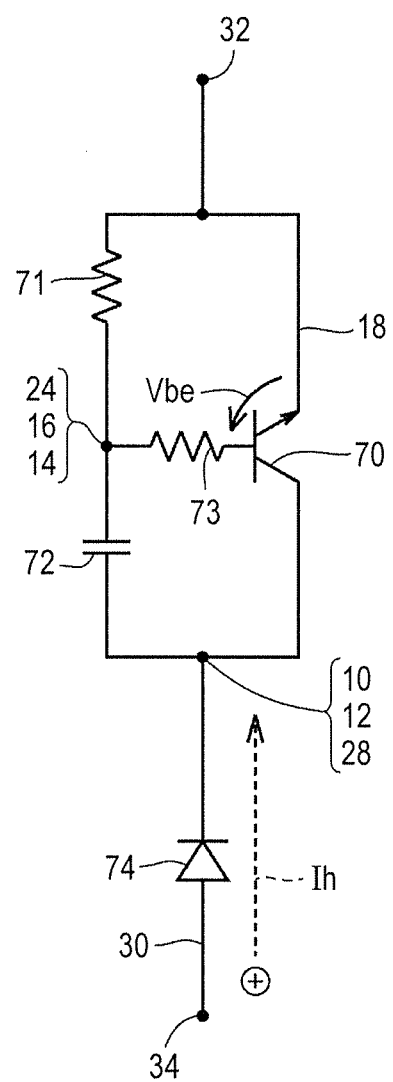
FIG. 26 shows a simple equivalent circuit in an off state of the IGBT element.

FIG. 26 shows a simple equivalent circuit of the IGBT element in an off state. FIG. 26 shows a portion of the equivalent circuit which passes through a mesa region near the gate trench electrode 20G from the collector electrode (back surface electrode) 34 of FIG. 3 and reaches the emitter electrode (front surface electrode) 32.

With reference to FIG. 3 and FIG. 26, first, a configuration of the equivalent circuit will be described. The IGBT element is provided with a parasitic NPN type bipolar transistor 70, which includes: an N+ type emitter region 18 as an emitter; a P type body layer 24 (further, a P+ type latch-up preventing region 14 and a P+ type body contact region 16) as a base; and an N– type drift layer 10 (further, an N type hole barrier layer 12 and an N type field stop layer 28) as a collector. The emitter (N+ type emitter region 18) of the parasitic NPN type bipolar transistor 70 is coupled with the emitter electrode 32. Furthermore, the base (P type body layer 24) of the parasitic NPN type bipolar transistor is also coupled with the emitter electrode 32 via a contact resistor 71 (a resistor between the P+ type body contact region 16 and the emitter electrode 32).

The resistor which the P type body layer 24 has is equivalent to the gate resistor 73 of FIG. 26. When the IGBT element is in an off state, depletion layer capacitance 72 exists between the collector (N– type drift layer 10) and the base (P type body layer 24) of the parasitic bipolar transistor 70. Furthermore, a PN-junction diode 74 is configured by the P type collector layer 30 and the N– type drift layer 10.

Next, an operation of the equivalent circuit will be explained. The hole current Ih passes through the P type body layer 24 (the P+ type latch-up preventing region 14 and the P+ type body contact region 16) from the N– type drift layer 10 and flows into the emitter electrode 32 via the contact resistor 71. At this time, a voltage Vbe of a forward bias between the base and the emitter of the parasitic NPN type bipolar transistor 70 can be expressed, with a value of the contact resistor 71 being R, as follows:

$$Vbe = Ih \times R$$

In this regard, when the hole current Ih is relatively strong or when the value R of the contact resistor 71 is relatively large, the voltage Vbe between the base and the emitter exceeds 0.7V or so (namely, a diffusion potential or a built-in potential of a silicon PN junction). Therefore, the parasitic NPN type bipolar transistor 70 is turned on.

In a cell where the parasitic NPN type bipolar transistor 70 is in an on state, an electric current uncontrollable by the gate voltage (voltage of the gate trench electrode 20G) of the IGBT element flows with a high voltage being applied to the collector electrode 34. There occurs a rise in temperature due to the generation of heat caused by the above electric current. Therefore, when an electric resistance becomes small, the reaction that an even stronger electric current flows will happen. As a result, a heavy electric current flows in the IGBT element locally and, after all, the IGBT element will be fractured. In the IGBT element 3 of Third Embodiment, in order to avoid such a problem, the arrangement of the P type floating region 36 is restricted.

[Configuration and Operation of IGBT Element]

Figure 27:
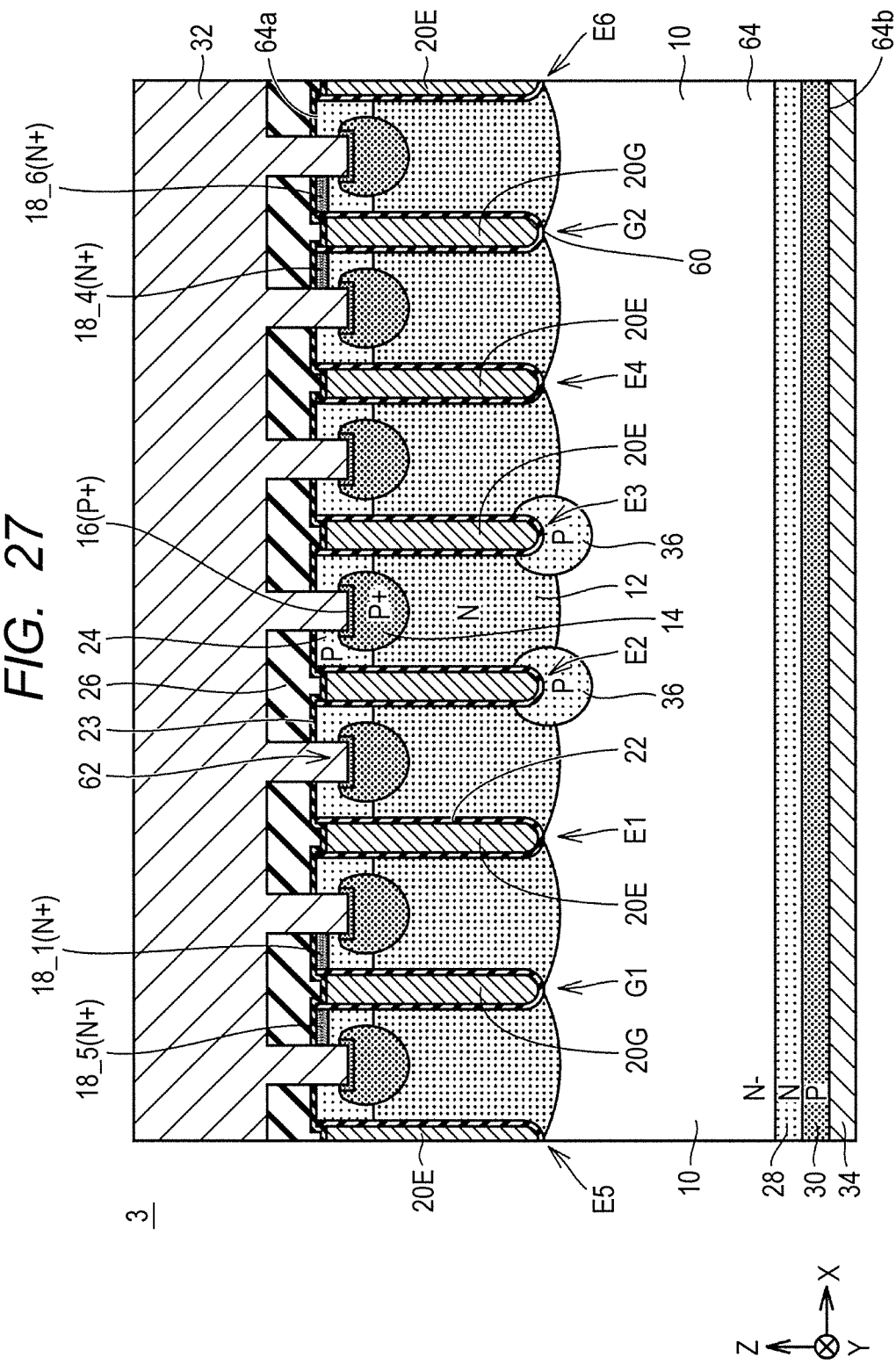
FIG. 27 is a cross-sectional view showing a configuration of an IGBT element according to Third Embodiment.

FIG. 27 is a cross-sectional view showing a configuration of the IGBT element 3 according to Third Embodiment. The IGBT element of FIG. 27 differs from the IGBT element 1 of FIG. 3 in that the P type floating region 36 is not provided near bottom portions of the emitter trench electrodes 20E (trenches E5, E1, E4, and E6) arranged next to the gate trench electrodes 20G (trenches G1 and G2). In other words, the P type floating region 36 of FIG. 27 is not in contact with either of the gate trench electrode 20G and the emitter trench electrode 20E adjacent to each other via the gate insulation film 22. Since the rest of the configuration of FIG. 27 is the same as that of the case in FIG. 3, the same or similar parts are denoted by the same reference characters and description thereof is not repeated.

Figure 28:
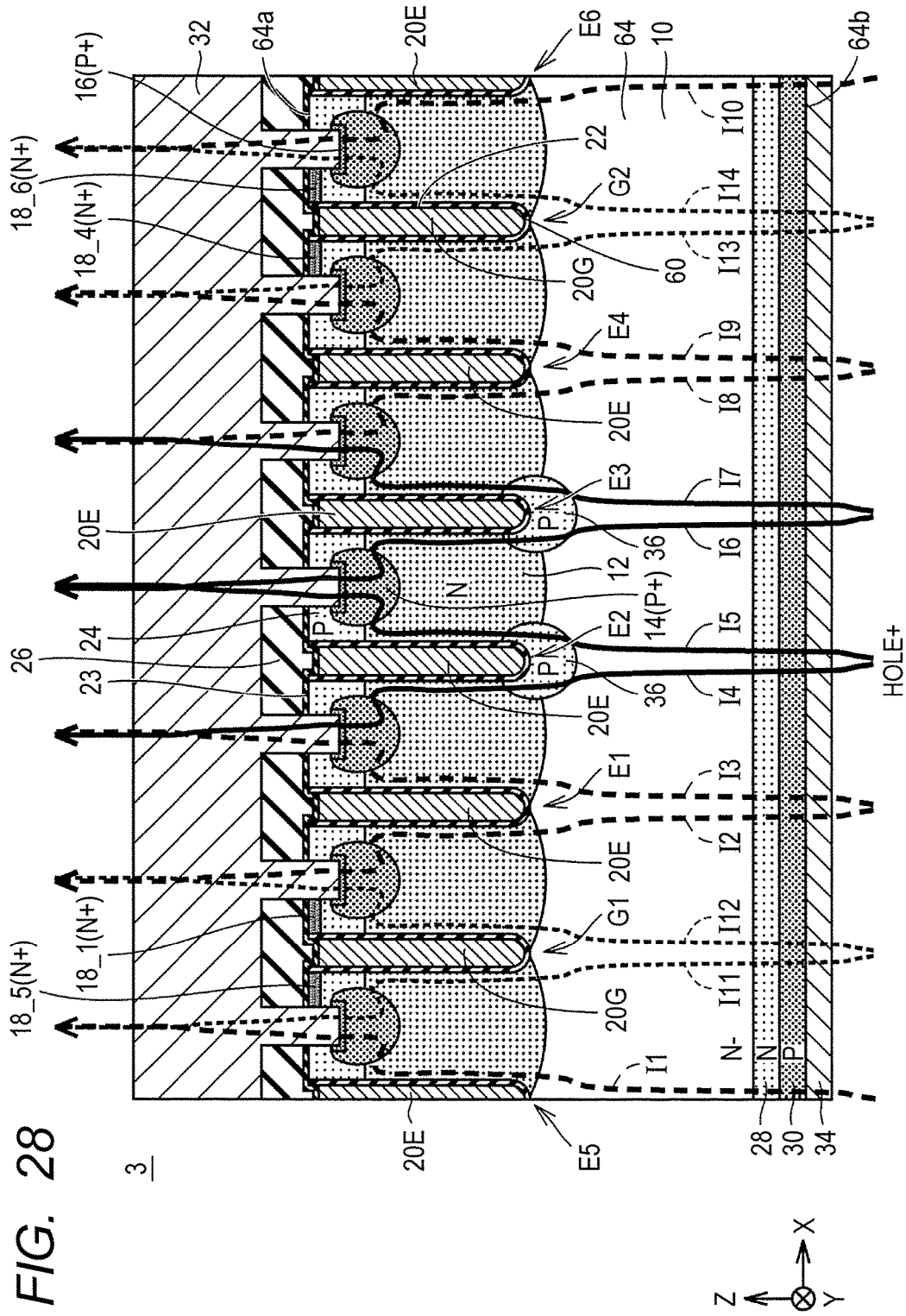
FIG. 28 illustrates a discharge operation of holes at the time of a turn-off in the IGBT element of FIG. 27.

FIG. 28 illustrates the hole discharge operation at the time of a turn-off in the IGBT element 3 of FIG. 27. In the IGBT element 3, the P type floating regions 36 are not provided near the bottom portions of the emitter trench electrodes 20E (trenches E5, E1, E4, and E6) arranged next to the gate trench electrodes 20G (trenches G1 and G2). Therefore, on both sides of the trenches E2 and E3 where the P type floating regions 36 are provided, there may flow hole currents I4, I5, I6, and I7 via the parasitic PMOS transistor described in FIG. 3. However, the hole currents I1, I2, I3, I8, I9, and I10 on the both sides of the trenches E5, E1, E4, and E6 are small as compared with the hole currents I4, I5, I6, and I7 via the parasitic PMOS transistor. As a result, hole currents I11, I12, I13, and I14 via the parasitic NPN type bipolar transistor explained in FIG. 26 is also less likely to be generated. Therefore, the fracture resistant amount of the IGBT element 3 can be raised.

Incidentally, in FIG. 28, when an N+ type emitter region 18_1 is not provided next to (+X direction side of) the trench G1 on the right side in which the gate trench electrode 20G is installed, the P type floating region 36 may be formed near the bottom portion of the trench E1 next to the trench G1. In this regard, even if the hole current I2 flows on the left side (−X direction side) of the trench E2 because of the parasitic PMOS transistor, there exists no parasitic NPN type bipolar transistor explained in FIG. 26 on the right side of the trench G1. Accordingly, even when the strong hole current I12 flows, there is no need to consider the operation of the parasitic NPN bipolar transistor.

Therefore, to be more precise, when the N+ type emitter region 18_1 is formed between the adjacent gate trench electrode 20G (trench G1) and the emitter trench electrode 20E (trench E1), there can be a configuration where there is not such a P type floating region 36 provided as to be in contact with the trench electrodes 20G (trench G1) and the emitter trench electrode 20E (trench E1) via the gate insulation film 22. In this case, the direction will be the one in which a strong hole current is not easily supplied to the parasitic NPN type bipolar transistor. Therefore, the operation of the parasitic NPN bipolar transistor is less likely to be started, raising the fracture resistant amount of the IGBT element 3.

<Fourth Embodiment>
[Configuration of IGBT Element]

Figure 29:
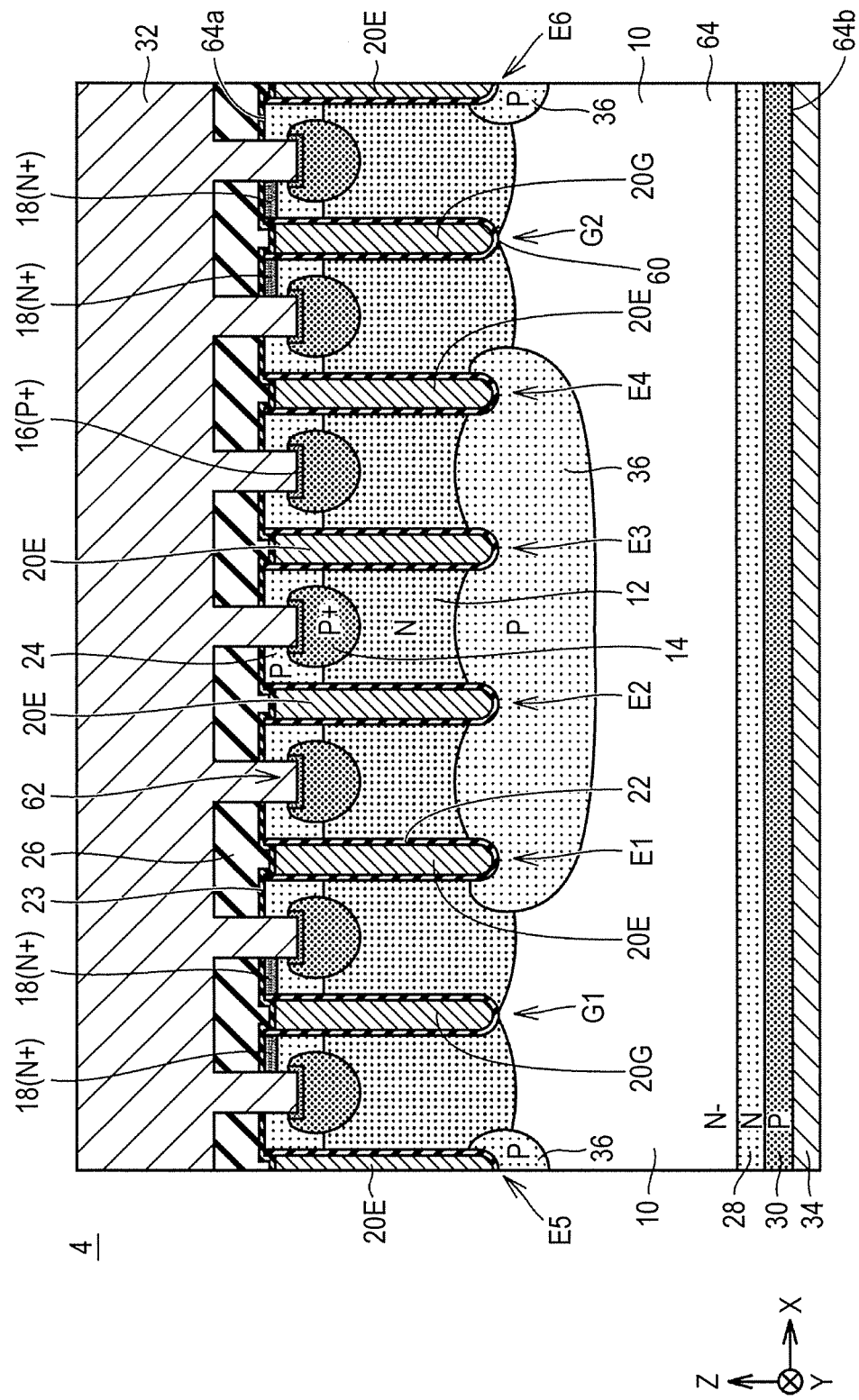
FIG. 29 is a cross-sectional view showing a configuration of an IGBT element according to Fourth Embodiment.

FIG. 29 is a cross-sectional view showing a configuration of an IGBT element 4 according to Fourth Embodiment.

The IGBT element 4 according to Fourth Embodiment is characteristic in that, in order to facilitate the provision of the element, a form of the P type floating region 36 is made different from that of the IGBT element 1 of First Embodiment. Specifically, in the case shown in FIG. 1, the P type floating regions 36 are provided independently near the bottom portions of the emitter trench electrodes 20E (trenches E1 to E4). On the other hand, in the case of FIG. 29, an integrated single P type floating region 36 is so formed as to be in contact with each of the bottom portions of at least two adjacent emitter trench electrodes 20E (trenches E1 to E4) via the gate insulation film 22.

The N+ type emitter region 18 is not provided in a region between the adjacent emitter trench electrodes 20E. Therefore, a MOSFET (Metal Oxide Semiconductor Field Effect Transistor) of the IGBT element 4 is not formed. That is, electrons are not supplied from the N+ type emitter region 18 to the region between the adjacent emitter trench electrodes 20E. In other words, the region between the adjacent emitter trench electrodes 20E simply serves as an exit for the holes supplied from the collector electrode layer 34. Therefore, even if this region is covered with the P type floating region 36, it does not pose a problem at all.

The P type floating region 36 of the configuration described above is formed using high energy implantation and, regardless of the shape of a surface, an injection part can be designed. Therefore, the P type floating region 36 of the above configuration has characteristic in that, as compared with the P type floating region 36 of the configuration shown in FIG. 1, a high level of pattern precision is not required, making it easier to manufacture the device. Furthermore, as compared with the case in FIG. 1, freedom of arrangement thereof in a plane of the semiconductor substrate 64 increases (a specific example of the arrangement will be explained in Fifth Embodiment).

Since the rest of the configuration shown in FIG. 29 is the same as that of the case in FIG. 1, the same or similar parts are denoted by the same reference characters and description thereof is not be repeated.

<Manufacturing Method of IGBT Element>

Figure 30:
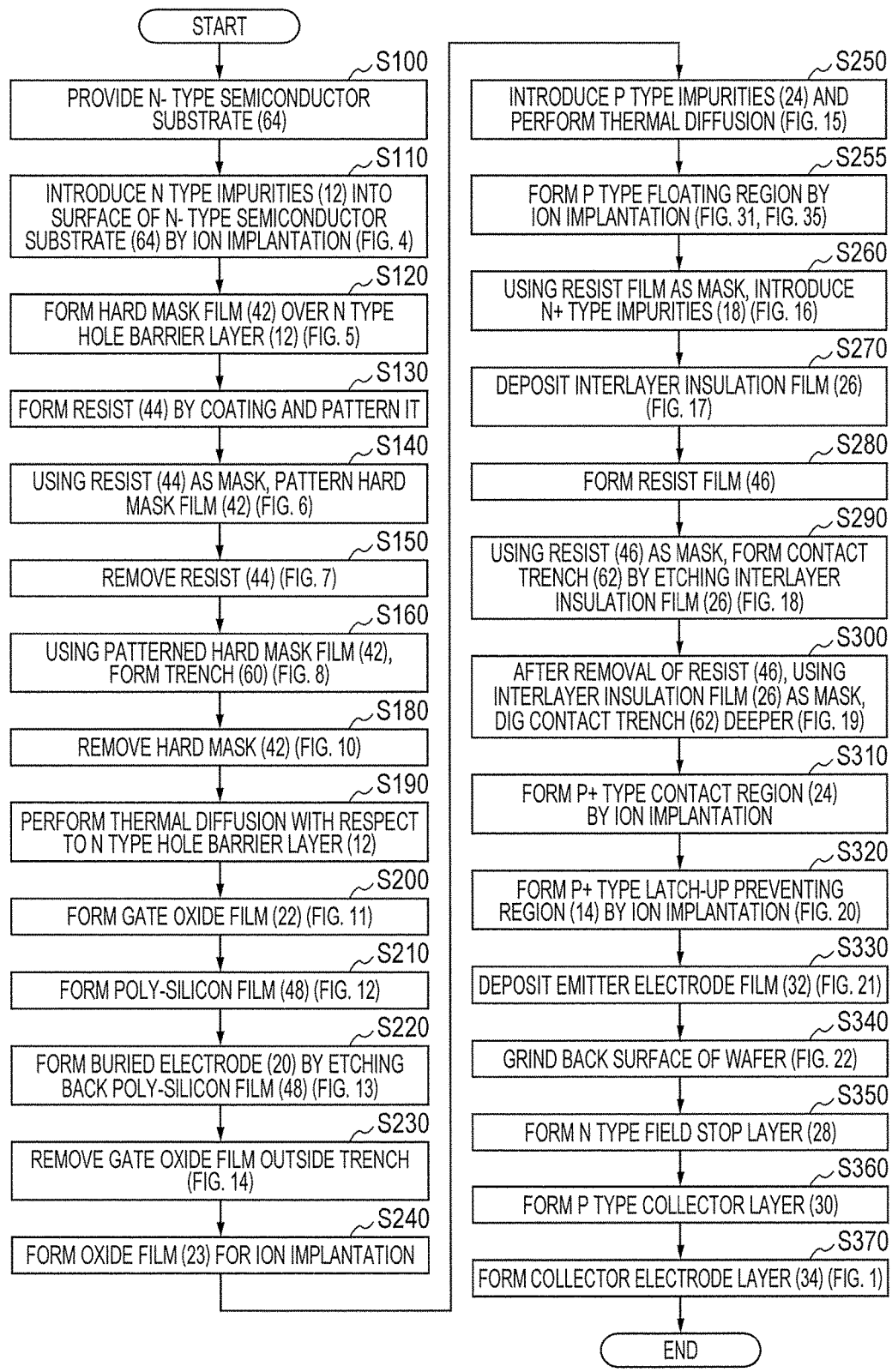
FIG. 30 is a flowchart showing manufacturing steps of the IGBT element in FIG. 29.

FIG. 30 is a flowchart showing manufacturing steps of the IGBT element 4 of FIG. 29. The order of steps for providing the P type floating region 36 in the flowchart of FIG. 30 is different from that in the flowchart of FIG. 23.

Specifically, in the case of First Embodiment shown in FIG. 23, each P type floating region 36 is formed by ion implantation (step S170) right after step 160 of forming the trench 60. That is, the P type floating region 36 is formed in a state (before steps S200 and S210) where the gate insulation film 22 and the buried electrode 20 are not formed inside the trench 60. On the contrary, in the case of Fourth Embodiment shown in FIG. 30, in place of step S170, after forming the gate insulation film 22 and the buried electrode 20 inside the trench 60 (after steps S200 and S210), the P type floating region 36 is formed by ion implantation of high energy (step S255).

Figure 31:
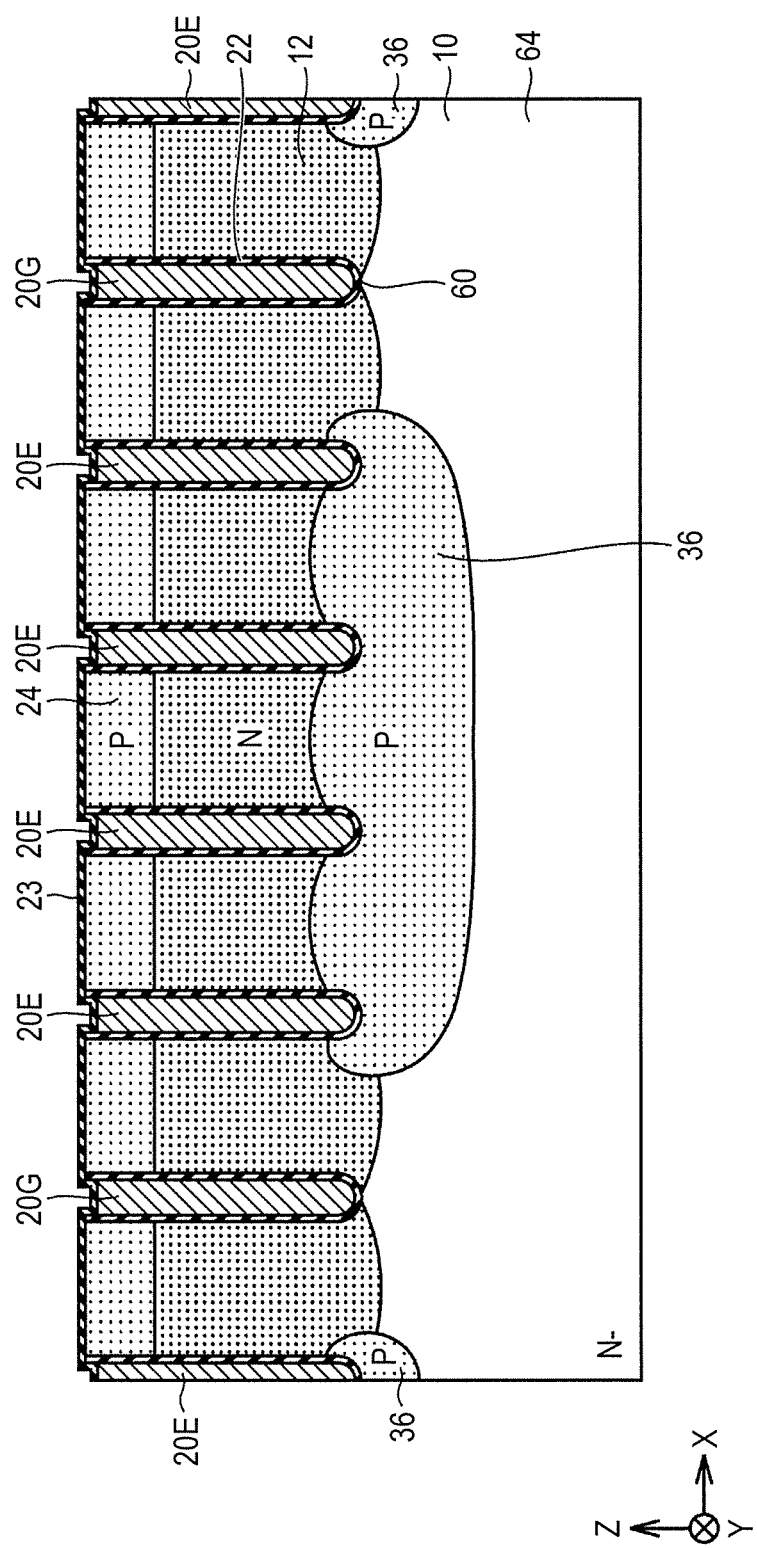
FIG. 31 is a cross-sectional view in a manufacturing step of the IGBT element in FIG. 29 after forming a P type floating region (after step S255 in FIG. 30)

FIG. 31 is a cross-sectional view in a manufacturing step of the IGBT in FIG. 29 after forming the P type floating region 36 (after step S255). The P type floating region 36 is formed by ion implantation using a resist (not shown) patterned by photolithography as a mask. The ion implantation conditions at this time are: for example, ion species: boron, dose amount: about $1 \times 10^{13}/cm^2$, and implantation energy: high energy of about 2 MeV. By carrying out ion implantation using such high energy, as shown in FIG. 31, the P type impurities (36) can be distributed in a relatively deep region.

Since other steps of FIG. 30 are the same as those of the case in FIG. 23, the same or similar parts are denoted by the same reference characters and description thereof is not repeated.

<Fifth Embodiment>
[Configuration and Manufacturing Method of IGBT Element 5]

Figure 32:
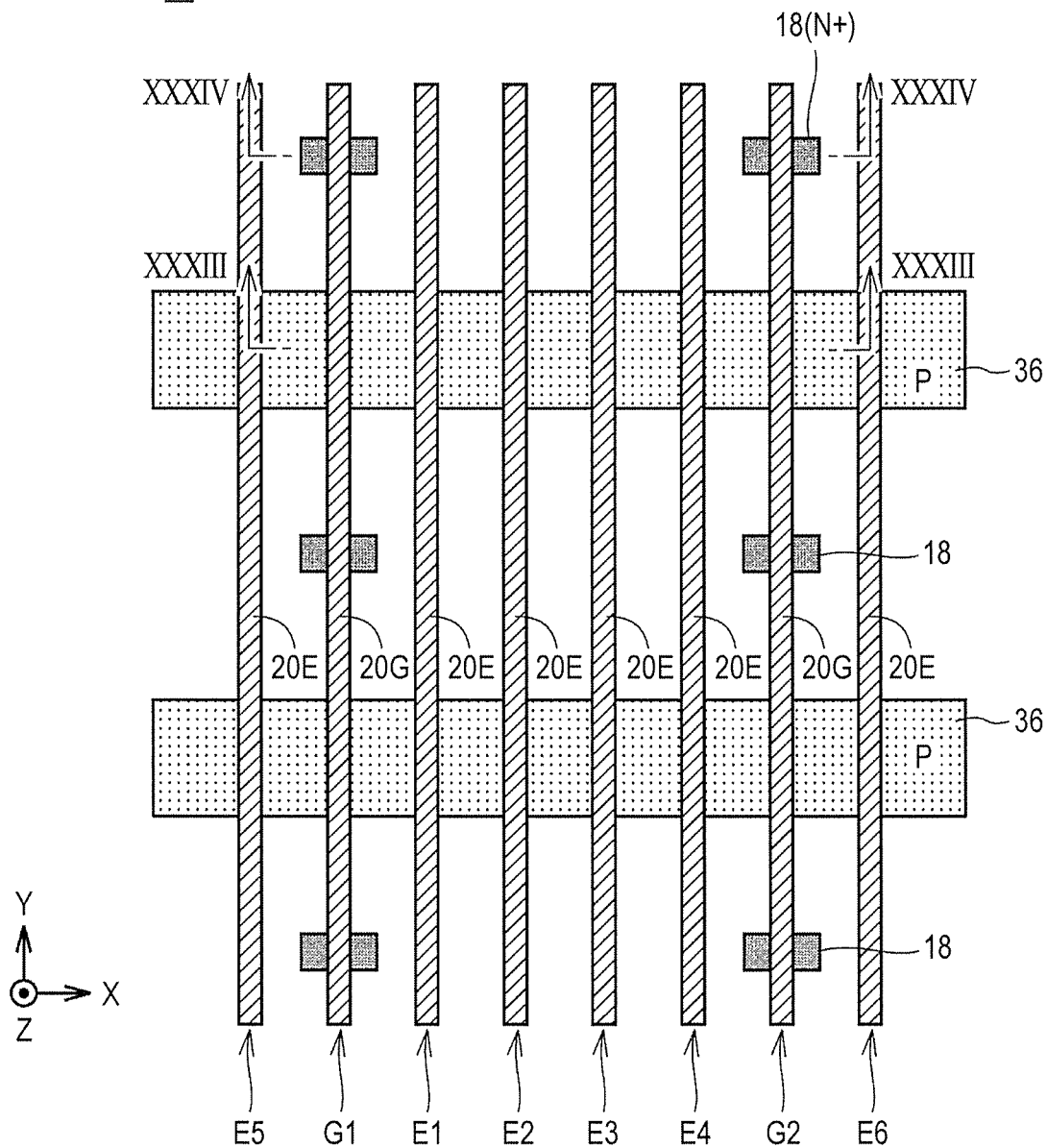
FIG. 32 shows, in an IGBT element of Fifth Embodiment, arrangement of a trench electrode, an N+ type emitter region, and a P type floating region in a substrate plane.
Figure 33:
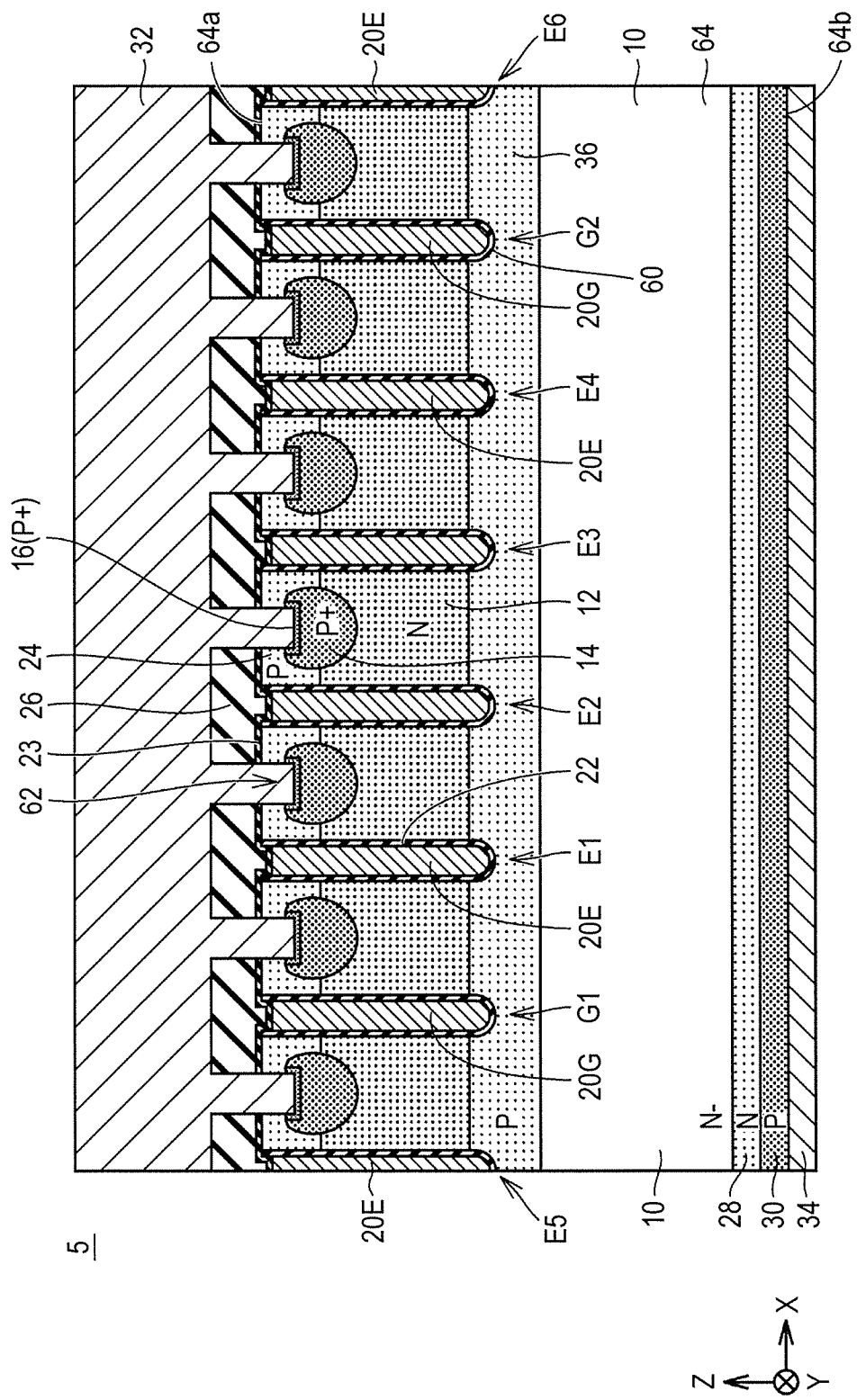
FIG. 33 is a cross-sectional view of the IGBT element taken along line XXXIII-XXXIII of FIG. 32.
Figure 34:
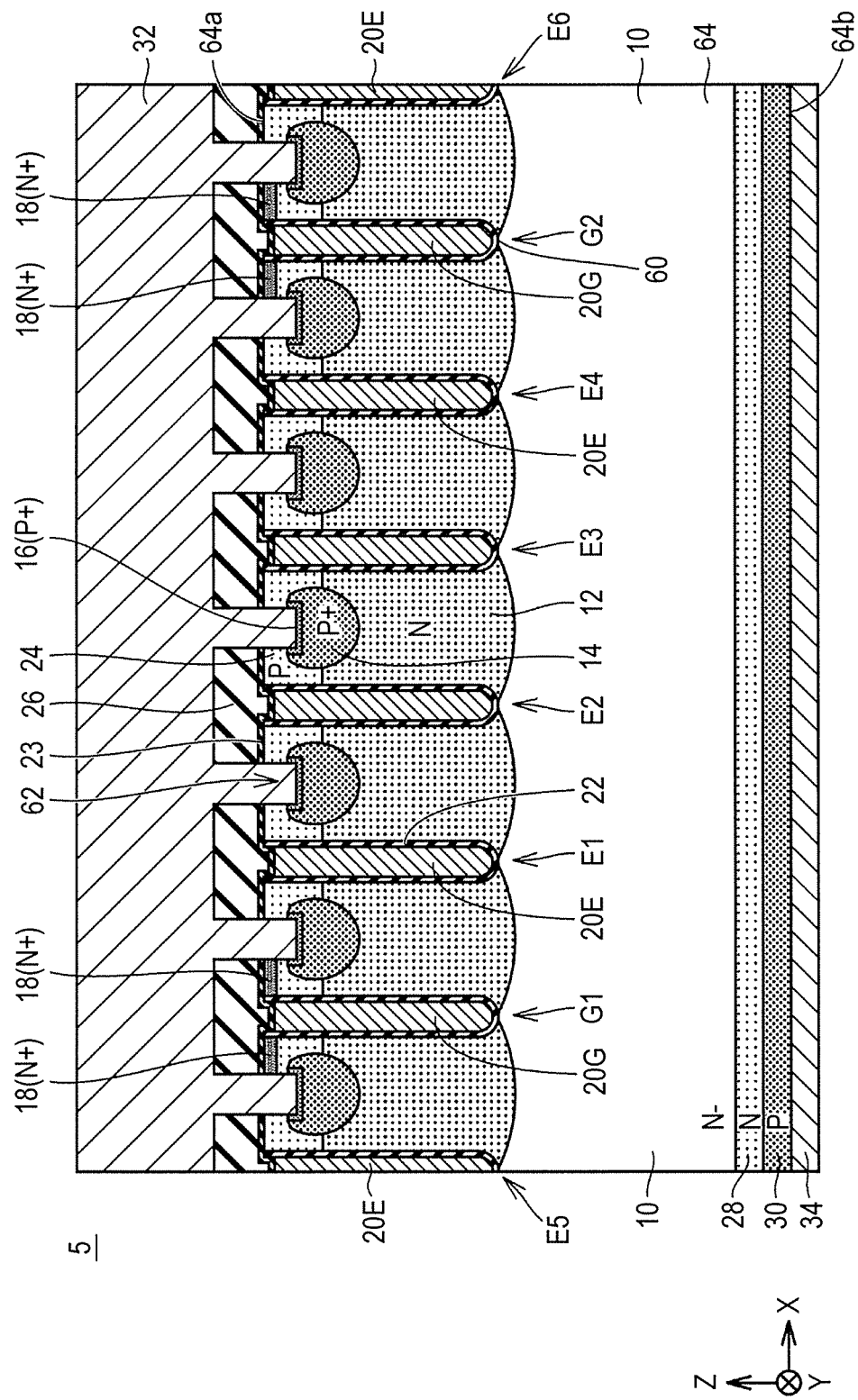
FIG. 34 is a cross-sectional view of the IGBT element taken along line XXXIV-XXXXIV of FIG. 32.

FIG. 32 shows, in the IGBT element 5 of Fifth Embodiment, arrangement of a trench electrode 20, an N+ type emitter region 18, and a P type floating region 36 in a substrate plane. FIG. 33 is a cross-sectional view of the IGBT element 5 taken along line XXXIII-XXXIII of FIG. 32. FIG. 34 is a cross-sectional view of the IGBT element 5 taken along line XXXIV-XXXIV of FIG. 32.

With reference to FIGS. 32 to 34, in the IGBT element 5, a plurality of N+ type emitter regions 18 which are provided adjacent to both sides of each gate trench electrode 20G are locally provided in Y direction. This can restrict a saturation current of the IGBT element 5.

On the other hand, the P type floating region 36 is, as seen in a plan view of the IGBT element 5, provided such that it extends in X direction while intersecting with trench electrodes 20G and 20E (trenches G1, G2, and E1 to E6). At the same time, in Y direction, the P type floating region 36 is divided into a plurality of sections and arranged. As shown in FIG. 33, each P type floating region 36 is in contact with a bottom portion of each of the trench electrodes 20G and 20E via the gate insulation film 22.

In this regard, a point to be noted is that, in a plan view of the IGBT element 5, the N+ type emitter region 18 and the P type floating region 36 are so arranged as not to overlap with each other. In this way, even if the gate trench electrode 20G and the P type floating region 36 are partially overlapped in a plan view, in the on state of the IGBT element 5, the supply of electrons from the N+ type emitter region 18 is not prevented.

The manufacturing steps of the IGBT element 5 are the same as those of the case of Fourth Embodiment explained in FIG. 30. That is, after forming the gate insulation film 22 and the buried electrode 20 inside the trench 60 (after steps S200 and S210), the P type floating region 36 is formed by ion implantation of high energy (step S255).

FIG. 35 is a cross-sectional view in a manufacturing step of the IGBT element 5 of FIG. 32 after forming the P type floating region 36 (after step S255 of FIG. 30). The cross-section of FIG. 35 shows a portion corresponding to the line XXXIII-XXXIII of FIG. 32. The P type floating region 36 is formed by ion implantation using a resist (not shown) patterned by photolithography as a mask. The resist is used for masking a portion where the P type floating region 36 is not formed in a plan view of FIG. 32. The ion implantation conditions are: for example, ion species; boron, dose amount; about $1 \times 10^{13}/cm^2$, and implantation energy; high energy of about 2 MeV. By ion implantation using such high energy, as shown in FIG. 35, P type impurities (36) can be formed in a relatively deep region.

[Configuration of IGBT Element 5A of First Modification]

Figure 36:
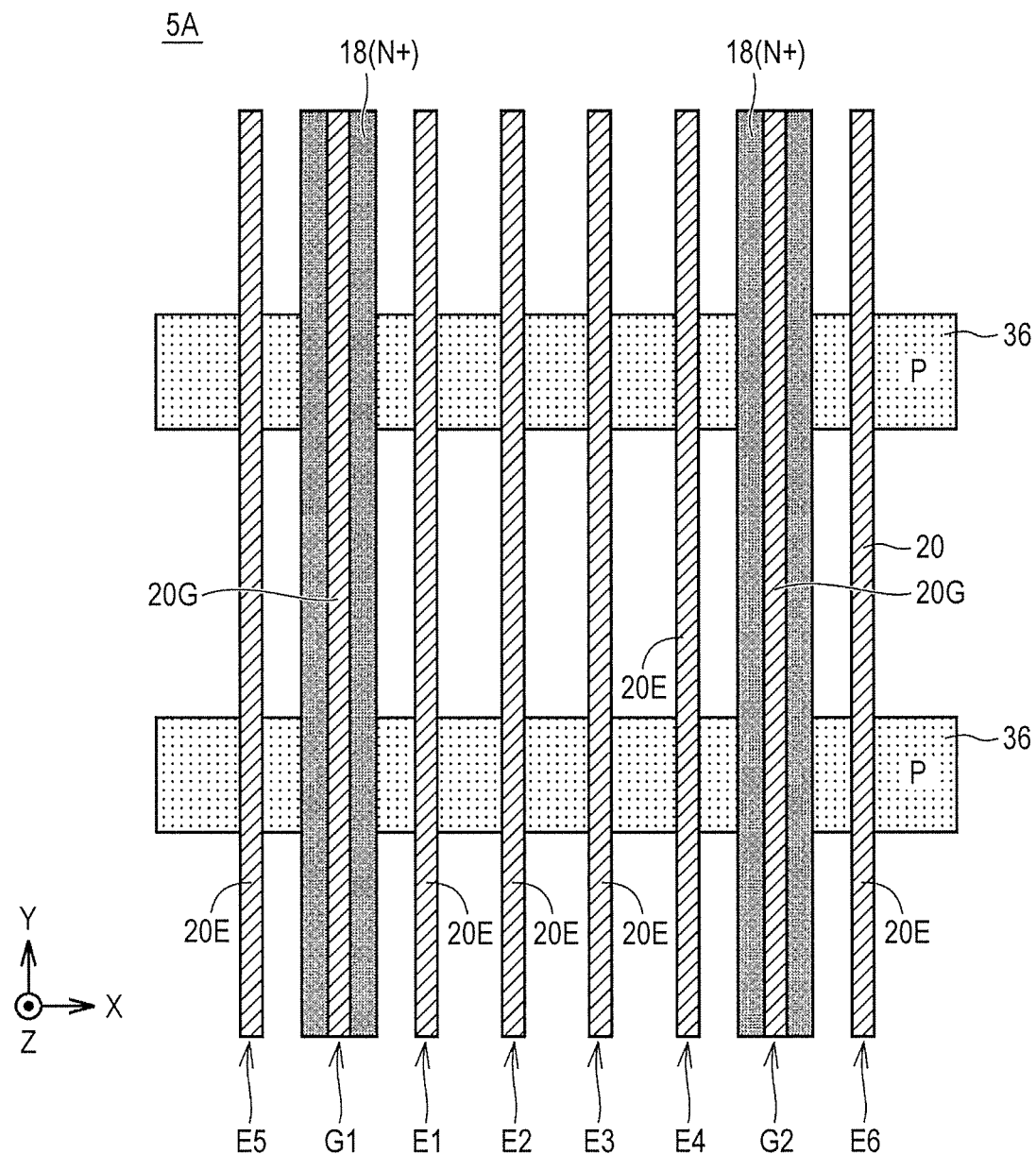
FIG. 36 shows, in an IGBT element of First Modification, arrangement of a trench electrode, an N+ type emitter region, and a P type floating region in a substrate plane.

FIG. 36 shows, in the IGBT element 5A of First Modification, arrangement of the trench electrode 20, the N+ type emitter region 18, and the P type floating region 36 in a substrate plane.

In the IGBT element 5A of FIG. 36, the N+ type emitter regions 18 adjacent to both sides of each gate trench electrode 20G extend in series in Y direction. Accordingly, a saturation current increases as compared to the case shown in FIG. 32. Therefore, the IGBT element 5A of FIG. 36 can be used for the case where the saturation current is not restricted.

The arrangement of the P type floating regions 36 is the same as in the case of FIG. 32. That is, in a plan view of the IGBT element 5A, the P type floating region 36 extends in X direction while intersecting with trench electrodes 20G and 20E (trenches G1, G2, and E1 to E6). Also, in Y direction, the P type floating region 36 is arranged, being divided into a plurality of sections. Each P type floating region 36 is in contact with a bottom portion of each trench electrode 20 via the gate insulation film 22.

In this regard, a point to be noted is as follows. That is, as seen in a plan view, each P type floating region 36 overlaps partially with the N+ type emitter region 18 being adjacent to the gate trench electrode 20G. However, a portion where the P type floating region 36 and the N+ type emitter region 18 overlap is limited to a part of the N+ type emitter region 18. Therefore, in the on state of the IGBT element, the supply of electrons from the N+ type emitter region 18 is hardly prevented.

[Configuration of IGBT Element 5B of Second Modification]

Figure 37:
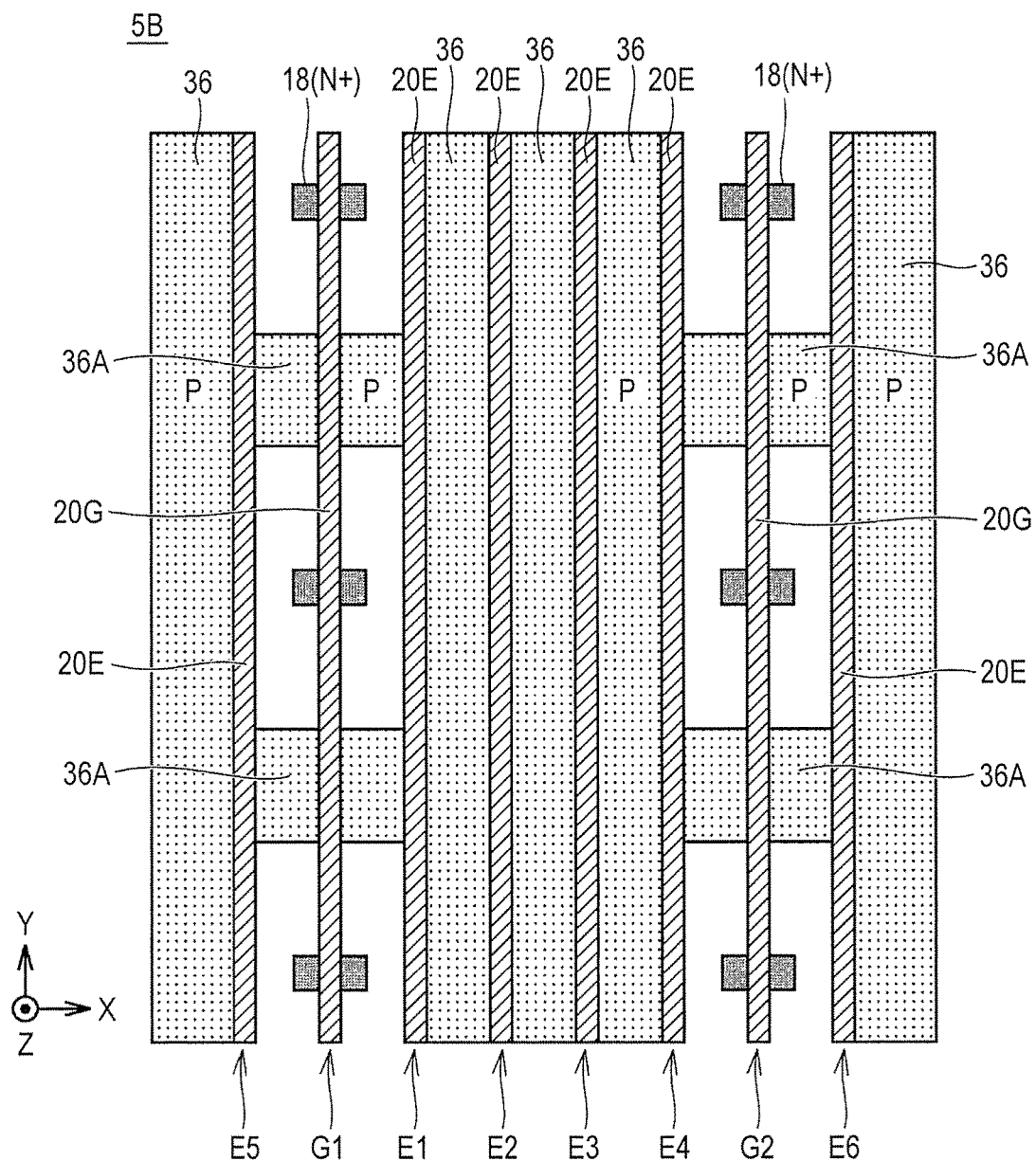
FIG. 37 shows, in an IGBT element of Second Modification, arrangement of the trench electrode, the N+ type emitter region, and the P type floating region in the substrate plane.

FIG. 37 shows, in the IGBT element 5B of Second Modification, arrangement of the trench electrode 20, the N+ type emitter region 18, and the P type floating region 36 in the substrate plane.

In the IGBT element 5B of FIG. 37, the arrangement of the N+ type emitter region 18 in the substrate plane is the same as in the case of FIG. 32. That is, a plurality of N+ type emitter regions 18 being adjacent to both sides of each gate trench electrode 20G are provided locally in Y direction.

On the other hand, in a plan view of the IGBT element 5B, the P type floating region 36 covers all the region between the adjacent emitter trench electrodes 20E. At the same time, the P type floating region 36 is in contact with whole the bottom portion of each emitter trench electrode 20E via the gate insulation film 22. Furthermore, these P type floating regions 36 are coupled by a joining part 36A (containing P type impurities) which intersects the gate trench electrode 20G and extends in X direction. The joining part 36A of the P type floating regions 36 is in contact with part of the bottom portion of the gate trench electrode 20G via the gate insulation film 22.

In a plan view of the IGBT element 5B, the N+ type emitter region 18 and the P type floating regions 36 and 36A are so arranged as not to overlap with each other. Therefore, in the on state of the IGBT element 5B, the supply of electrons from the N+ type emitter region 18 is not prevented.

[Configuration of IGBT Element 5C of Third Modification]

Figure 38:
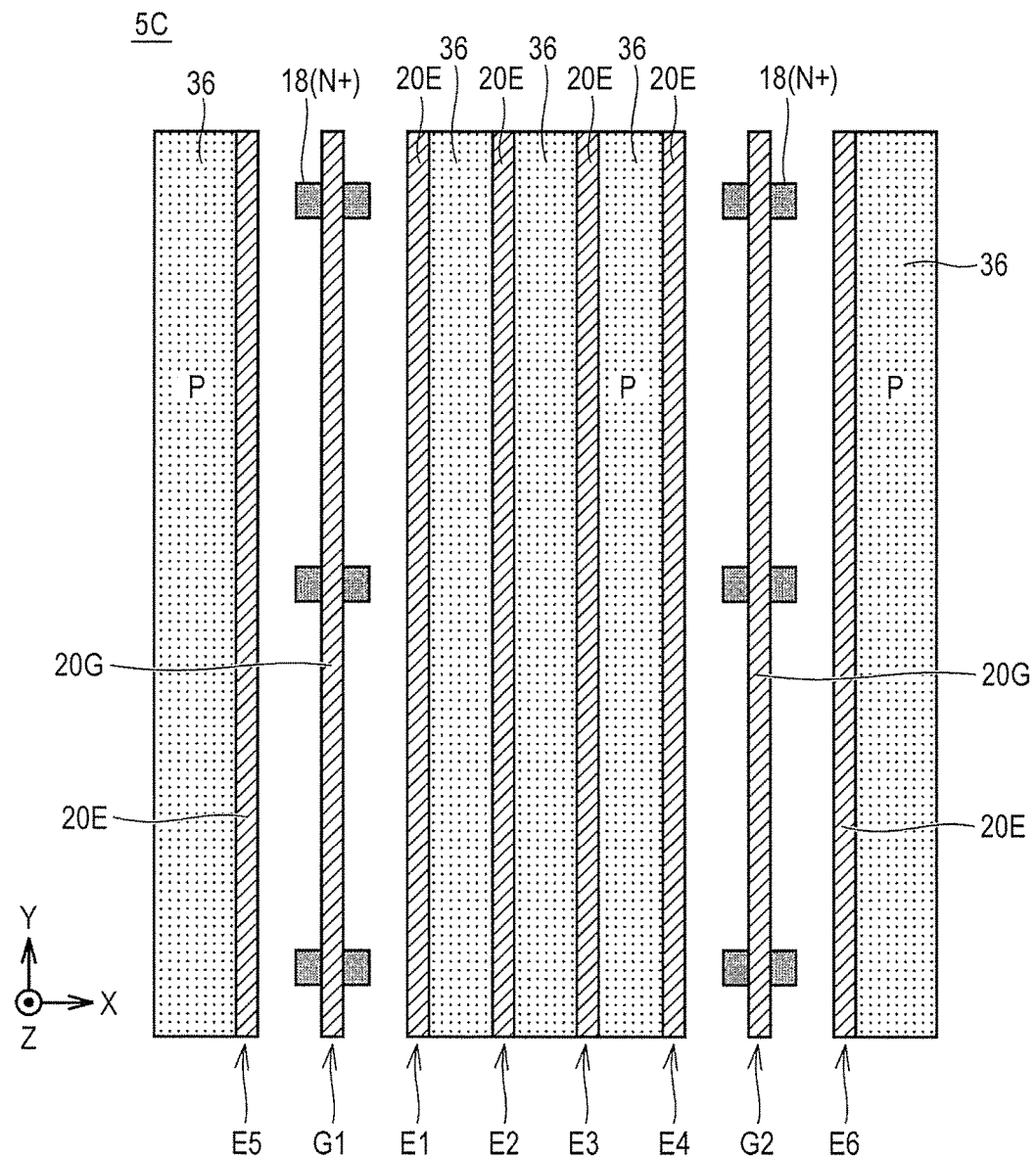
FIG. 38 shows, in an IGBT element of Third Modification, arrangement of the trench electrode, the N+ type emitter region, and the P type floating region in the substrate plane.

FIG. 38 shows, in the IGBT element 5C of Third Modification, arrangement of the trench electrode 20, the N+ type emitter region 18, and the P type floating region 36 in the substrate plane.

In the IGBT element 5C of FIG. 38, the arrangement of the N+ type emitter region 18 in the substrate plane is the same as in the cases of FIGS. 32 and 37. That is, a plurality of N+ type emitter regions 18 being adjacent to both sides of each gate trench electrode 20G are provided locally in Y direction.

On the other hand, in a plan view of the IGBT element 5C, the P type floating region 36 covers all the region between the adjacent emitter trench electrodes 20E. At the same time, the P type floating region 36 is in contact with whole the bottom portion of each emitter trench electrode 20E via the gate insulation film 22. In this respect, the arrangement of the P type floating region 36 of FIG. 38 is similar to the arrangement of the P type floating region 36 of FIG. 37. However, in the case of FIG. 38, unlike the case of FIG. 37, the joining part 36A which intersects each gate trench electrode 20G and extends in X direction is not provided.

Similar to the case shown in FIG. 37, as seen in a plan view of the IGBT element 5C, the N+ type emitter region 18 and the P type floating region 36 are so arranged as not to overlap with each other. Therefore, in the on state of the IGBT element 5C, the supply of electrons from the N+ type emitter region 18 is not prevented.

[Configuration of IGBT Element 5D of Fourth Modification]

Figure 39:
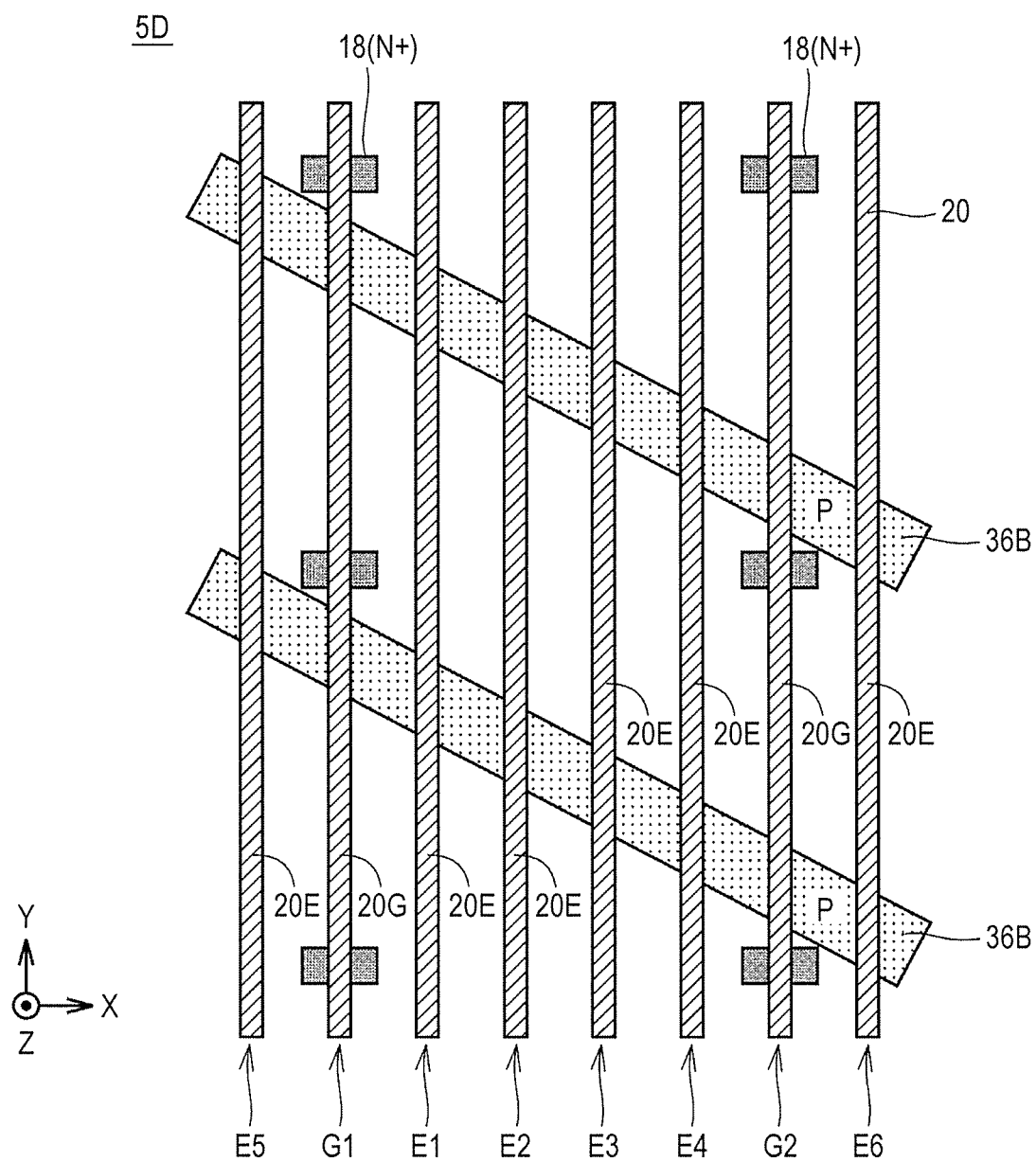
FIG. 39 shows, in an IGBT element of Fourth Modification, arrangement of the trench electrode, the N+ type emitter region, and the P type floating region in the substrate plane.

FIG. 39 shows, in the IGBT element 5D of Fourth Modification, arrangement of the trench electrode 20, the N+ type emitter region 18, and the P type floating region 36 in the substrate plane.

In the IGBT element 5D of FIG. 39, the arrangement of the N+ type emitter region 18 in the substrate plane is the same as in the cases of FIG. 32, FIG. 37, and FIG. 38. That is, a plurality of N+ type emitter regions 18 being adjacent to both sides of each gate trench electrode 20G are provided locally in Y direction.

On the other hand, in a plan view of the IGBT element 5D, P type floating regions 36B are so formed as to intersect the trench electrodes 20G and 20E and to extend in an oblique direction. That is, in a plan view of the IGBT element 5D, the P type floating regions 36B partially overlap the trench electrodes 20G and 20E. In the overlapped portion, the P type floating region 36B is in contact with the bottom portions of the trench electrodes 20G and 20E via the gate insulation film 22.

In a plan view of the IGBT element 5D, the N+ type emitter region 18 and the P type floating region 36B are so arranged as not to overlap with each other. Therefore, in the on state of the IGBT element 5C, the supply of electrons from the N+ type emitter region 18 is not prevented.

[Configuration of IGBT Element 5D of Fifth Modification]

Figure 40:
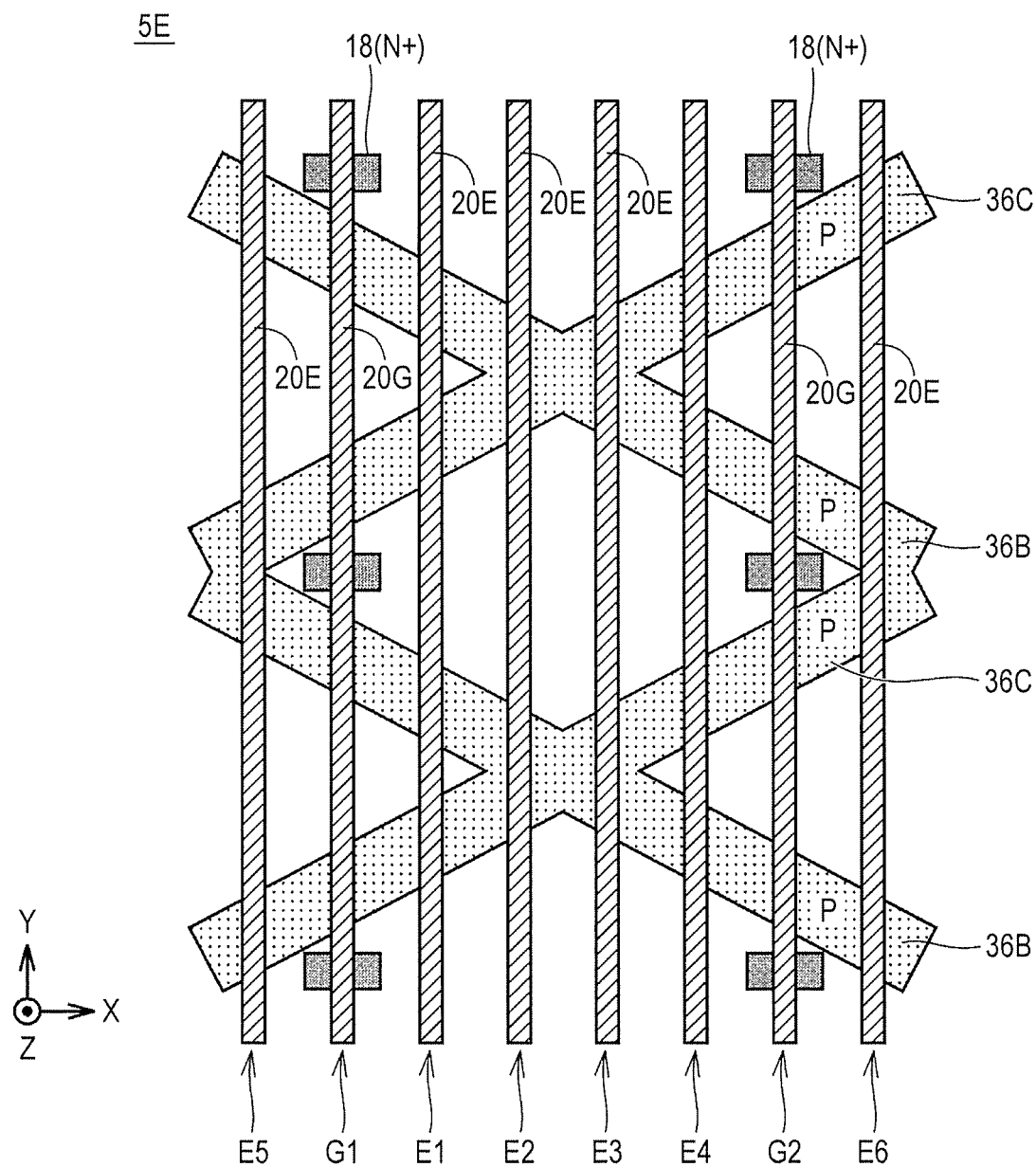
FIG. 40 shows, in an IGBT element of Fifth Modification, arrangement of the trench electrode, the N+ type emitter region, and the P type floating region in the substrate plane.

FIG. 40 shows, in the IGBT element 5E of Fifth Modification, the arrangement of the trench electrode 20, the N+ type emitter region 18, and the P type floating regions 36B and 36C in the substrate plane.

The IGBT element 5E of FIG. 40 is a modification of the IGBT element 5D of FIG. 39. Specifically, as to the IGBT element 5E of FIG. 40 in a plan view, there is further provided a floating region 36C which intersects the floating region 36B of FIG. 39, and which intersects the trench electrodes 20G and 20E and extends in an oblique direction.

In the plan view of the IGBT element 5E, the N+ type emitter region 18 and the P type floating regions 36B and 36C are so arranged as not to overlap. Therefore, in the on state of the IGBT element 5C, the supply of electrons from the N+ type emitter region 18 is not prevented.

Although the invention made by the present inventors has been specifically described based on the preferred embodiments, the invention is not limited thereto. It is apparent that various modifications can be made to the embodiments without departing from the scope of the invention.

What is claimed is:

1. A semiconductor device, comprising:
   a semiconductor substrate of a first conductive type having a first main surface and a second main surface;
   a first impurity layer of a second conductive type formed over the first main surface;
   a second impurity layer of the second conductive type formed over the second main surface;
   a plurality of trench electrodes extending along a first direction, in a plan view of the semiconductor substrate, being arranged in a row in a second direction orthogonal to the first direction, each of the trench electrodes being embedded, via an insulation film, inside the trench so formed as to pass through the first impurity layer and to reach an inner portion of the semiconductor substrate, the trench electrodes including:
   a plurality of gate trench electrodes to which gate potential is given; and
   a plurality of emitter trench electrodes to which emitter potential is given;
   an emitter electrode layer having the emitter potential so formed over the first main surface as to relate to the trench electrodes via an interlayer insulation layer and to be electrically coupled to the first impurity layer between each adjacent trench electrodes of all the trench electrodes;
   one or more first impurity regions of the second conductive type formed being spaced from the first and second impurity layers inside the semiconductor substrate and being in contact with bottom portions of at least some of the emitter trench electrodes via the insulation film; and
   a plurality of second impurity regions of the first conductive type formed over a front surface portion of the first impurity layer, being adjacent to both sides or one side of the each gate trench electrode via the insulation film;
   a plurality of third impurity regions of the first conductive type each formed between each adjacent trench electrodes of all the trench electrodes and being in contact with the first impurity layer; and
   a fourth impurity region of the first conductive type formed between the second impurity layer and the third impurity regions,
   wherein the bottom portions of the gate trench electrodes are in contact with the fourth impurity region or the third impurity regions via the insulation film without the first impurity regions.

2. The semiconductor device according to claim 1, wherein each of the one or more first impurity regions is provided near a bottom portion of any of the emitter trench electrodes.

3. The semiconductor device according to claim 1, wherein a width of the each trench is not uniform and the each trench has a portion wider than other portions.

4. The semiconductor device according to claim 1, wherein any of the one or more first impurity regions is not in contact with the gate trench electrodes via the insulation film.

5. The semiconductor device according to claim 4, wherein at least the one gate trench electrode and at least the one emitter trench electrode are arranged alternately in the second direction, and
wherein, in a case where the second impurity region is formed between the adjacent gate trench electrode and the emitter trench electrode, any of the one or more first impurity regions is not in contact with the emitter trench electrode positioned next to the gate trench electrode via the insulation film.

6. The semiconductor device according to claim 1, wherein at least the one gate trench electrodes and at least the two emitter trench electrodes are arranged alternately in the second direction, and
wherein, each of the one or more first impurity regions is so arranged as to overlap with at least the two adjacent emitter trench electrodes in a plan view of the semiconductor substrate and to be in contact with a bottom portion of the each emitter trench electrode being overlapped in a plan view via the insulation film.

7. The semiconductor device according to claim 1,
wherein at least the one gate trench electrode and at least the one emitter trench electrode are arranged alternately in the second direction, and
wherein, in a plan view of the semiconductor substrate, each of the one or more first impurity regions is so arranged as to partially overlap with at least the one gate trench electrode, and to overlap with each of the adjacent trench electrodes including at least the one gate trench electrode, and to be in contact with a bottom portion of the each trench electrode being overlapped in a plan view via the insulation film.

8. The semiconductor device according to claim 7, wherein the second impurity region adjacent to the gate trench electrode so arranged as to partially overlap with the first impurity region in a plan view of the semiconductor substrate does not overlap with the first impurity region or partially overlaps with the first impurity region.

* * * * *